United States Patent
Luo et al.

(10) Patent No.: US 11,037,624 B2
(45) Date of Patent: Jun. 15, 2021

(54) DEVICES FOR PROGRAMMING RESISTIVE CHANGE ELEMENTS IN RESISTIVE CHANGE ELEMENT ARRAYS

(71) Applicant: Nantero, Inc., Woburn, MA (US)

(72) Inventors: Jia Luo, Fremont, CA (US); Sheyang Ning, Milpitas, CA (US); Lee E. Cleveland, Santa Clara, CA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 16/600,025

(22) Filed: Oct. 11, 2019

(65) Prior Publication Data

US 2020/0098429 A1 Mar. 26, 2020

Related U.S. Application Data

(63) Continuation of application No. 15/853,772, filed on Dec. 23, 2017, now Pat. No. 10,446,228.

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/0023* (2013.01); *G11C 13/0038* (2013.01); *G11C 2013/009* (2013.01); *G11C 2013/0092* (2013.01); *G11C 2213/72* (2013.01); *G11C 2213/76* (2013.01); *G11C 2213/79* (2013.01)

(58) Field of Classification Search
CPC ... G11C 16/0483; G11C 29/028; G11C 16/10; G11C 13/004; G11C 16/26; G11C 13/0069; G11C 7/222; G11C 11/419; G11C 11/5642; G11C 2213/79; G11C 7/1051; G11C 16/3459; G11C 13/025; G11C 2213/35; G11C 13/0007; G11C 2213/72; G11C 13/0061; G11C 2213/71; G11C 2213/77; G11C 2013/0054; H01L 27/2463; H01L 27/2481; H01L 27/285; H01L 45/1233; H01L 45/149; H01L 51/0048; H01L 27/2409; H01L 27/249; H01L 45/04; H01L 45/1226; H01L 45/1608; H01L 45/165; H01L 45/1675; H01L 51/0579
USPC .. 365/148, 191, 189.05, 189.02, 189.15, 51, 365/163, 185.17, 189.16, 193, 222, 63, 365/185.19, 185.22, 189.011, 189.09, 365/194, 198, 230.03, 230.05
See application file for complete search history.

(56) References Cited

U.S. PATENT DOCUMENTS

2008/0151608 A1* 6/2008 Hosotani ................. G11C 11/16
365/158

* cited by examiner

*Primary Examiner* — Thong Q Le
(74) *Attorney, Agent, or Firm* — Nantero, Inc.

(57) ABSTRACT

Devices and methods for programming resistive change elements using an electrical stimulus are disclosed. According to some aspects of the present disclosure the devices and methods program at least one resistive change element within at least one resistive change element cell in a resistive change element array using an electrical stimulus having a voltage level greater than a steady state voltage level that can be supplied by a power supply.

20 Claims, 23 Drawing Sheets

460

---

Generating a first voltage waveform and a second voltage waveform in response to a current stimulus, where the first voltage waveform oscillates around a first voltage and the second voltage waveform oscillates around a second voltage ⟿ 462

↓

Transmitting at least part of the first voltage waveform and at least part of the second voltage waveform to a resistive change element cell to apply an electrical stimulus to the resistive change element cell, where the electrical stimulus has a voltage greater than a difference between the first voltage and the second voltage ⟿ 464

Generating a first voltage waveform in response to a current stimulus, where the first voltage waveform oscillates around a first voltage — 562

Transmitting at least part of the first voltage waveform and a second voltage to a resistive change element cell to apply an electrical stimulus to the resistive change element cell, where the second voltage has a substantially constant voltage level, and where the electrical stimulus has a voltage greater than a difference between the first voltage and the second voltage — 564

FIG. 5B

DEVICES FOR PROGRAMMING RESISTIVE CHANGE ELEMENTS IN RESISTIVE CHANGE ELEMENT ARRAYS

CROSS-REFERENCE OF RELATED CASES

This application is related to the following U.S. Patents, which are assigned to the assignee of the present application, and are hereby incorporated by reference in their entirety:

U.S. Pat. No. 7,781,862, filed on Nov. 15, 2005, entitled Two-Terminal Nanotube Devices and Systems and Methods of Making Same; and U.S. Pat. No. 7,835,170, filed on Aug. 8, 2007, entitled Memory Elements and Cross Point Switches and Arrays of Same Using Nonvolatile Nanotube Blocks.

This application is related to the following U.S. Patent Application, which is assigned to the assignee of the present application, and is hereby incorporated by reference in its entirety:

U.S. patent application Ser. No. 15/136,414, filed on Apr. 22, 2016, entitled Methods for Enhanced State Retention Within a Resistive Change Cell;

BACKGROUND

Technical Field

The present disclosure generally relates to devices and methods for programming resistive change elements.

Discussion of Related Art

Any discussion of the related art throughout this specification should in no way be considered as an admission that such art is widely known or forms part of the common general knowledge in the field.

Resistive change devices and arrays, often referred to as resistance RAMS by those skilled in the art, are well known in the semiconductor industry. Such devices and arrays, for example, include, but are not limited to, phase change memory, solid electrolyte memory, metal oxide resistance memory, and carbon nanotube memory such as NRAM®.

Resistive change devices and arrays store information by adjusting a resistive change element, typically comprising some material that can be adjusted between a number of non-volatile resistive states in response to some applied stimuli, within each individual array cell between two or more resistive states. For example, each resistive state within a resistive change element cell can correspond to a data value which can be programmed and read back by supporting circuitry within the device or array.

For example, a resistive change element might be arranged to switch between two resistive states: a low resistive state (which might correspond to a logic 1) and a high resistive state (which might correspond to a logic 0). In this way, a resistive change element can be used to store one binary digit (bit) of data.

Or, as another example, a resistive change element might be arranged to switch between four resistive states, so as to store two bits of data. Or a resistive change element might be arranged to switch between eight resistive states, so as to store three bits of data. Or a resistive change element might be arranged to switch between 2n resistive states, so as to store n bits of data.

Within the current state of the art, there is an increasing need to reduce the number of different voltage levels supplied on chip and reduce the steady state voltages levels supplied on chip.

SUMMARY

The present disclosure provides a resistive change element device comprising a plurality of resistive change element cells, a power supply having a first output configured to generate a first voltage waveform in response to a current stimulus and a second output configured to generate a second voltage waveform in response to the current stimulus, where the first voltage waveform oscillates around a first voltage and the second voltage waveform oscillates around a second voltage, a current stimulus circuit electrically connected to the first output and the second output, where the current stimulus circuit is configured to create the current stimulus by changing an amount of current flowing from the first output and an amount of current flowing into the second output, and an address decoder and driver circuit electrically connected to the plurality of resistive change element cells, the first output, and the second output, where the address decoder and driver circuit is configured to transmit at least part of the first voltage waveform and at least part of the second voltage waveform to at least one resistive change element cell in the plurality of resistive change element cells.

According to another aspect of the present disclosure, the power supply is configured so that the first output has an inductance sized for generating the first voltage waveform and a capacitance sized for generating the first voltage waveform, and the power supply is configured so that the second output has an inductance sized for generating the second voltage waveform and a capacitance sized for generating second voltage waveform.

According to another aspect of the present disclosure, the resistive change element device further comprises an inductor electrically connected to the first output, where the inductor is sized for generating the first voltage waveform.

According to another aspect of the present disclosure, the resistive change element device further comprises a capacitor electrically connected to the first output, where the capacitor is sized for generating the first voltage waveform.

According to another aspect of the present disclosure, the resistive change element device further comprises an inductor electrically connected to the second output, where the inductor is sized for generating the second voltage waveform.

According to another aspect of the present disclosure, the resistive change element device further comprises a capacitor electrically connected to the second output, where the capacitor is sized for generating the second voltage waveform.

According to another aspect of the present disclosure, the current stimulus circuit comprises a field effect transistor.

According to another aspect of the present disclosure, the current stimulus circuit further comprises a resistor electrically connected to the field effect transistor.

According to another aspect of the present disclosure, the plurality of resistive change element cells are a plurality of 1T1R resistive change element cells.

According to another aspect of the present disclosure, the plurality of resistive change element cells are a plurality of 1D1R resistive change element cells.

According to another aspect of the present disclosure, the plurality of resistive change element cells are a plurality of 1-R resistive change element cells.

The present disclosure provides a resistive change element device comprising a plurality of resistive change element cells, a power supply having a first output configured to generate a first voltage waveform in response to a current stimulus and a second output configured to supply a second voltage, where the first voltage waveform oscillates around a first voltage, a current stimulus circuit electrically connected to the first output and the second output, where the current stimulus circuit is configured to create the current stimulus by changing an amount of current flowing from the first output and an amount of current flowing into the second output, and an address decoder and driver circuit electrically connected to the plurality of resistive change element cells, the first output, and the second output, where the address decoder and driver circuit is configured to transmit at least part of the first voltage waveform and the second voltage to at least one resistive change element cell in the plurality of resistive change element cells.

The present disclosure provides a method for programming a resistive change element, the method comprising generating a first voltage waveform and a second voltage waveform in response to a current stimulus, where the first voltage waveform oscillates around a first voltage and the second voltage waveform oscillates around a second voltage; and transmitting at least part of the first voltage waveform and at least part of the second voltage waveform to a resistive change element cell to apply an electrical stimulus to the resistive change element cell, where the electrical stimulus has a voltage greater than a difference between the first voltage and the second voltage.

According to another aspect of the present disclosure, the first voltage waveform and the second voltage waveform are approximately 180 degrees out of phase.

According to another aspect of the present disclosure, the current stimulus has a plurality of current spikes.

According to another aspect of the present disclosure, the first voltage is a first steady state voltage and the second voltage is a second steady state voltage.

According to another aspect of the present disclosure, the first steady state voltage is 2.5 volts and the second steady state voltage is 0 volts.

According to another aspect of the present disclosure, the electrical stimulus is a periodic electrical stimulus.

According to another aspect of the present disclosure, the resistive change element cell comprises a nanotube fabric layer.

The present disclosure provides a method for programming a resistive change element, the method comprising generating a first voltage waveform in response to a current stimulus, where the first voltage waveform oscillates around a first voltage and transmitting at least part of the first voltage waveform and a second voltage to a resistive change element cell to apply an electrical stimulus to the resistive change element cell, where the second voltage has a substantially constant voltage level, and where the electrical stimulus has a voltage greater than a difference between the first voltage and the second voltage.

Other features and advantages of the present disclosure will become apparent from the following description, which is provided below in relation to the accompanying drawings.

BRIEF DESCRIPTION OF DRAWINGS

FIG. 4B illustrates a flow chart for showing a method for programming a resistive change element.
FIG. 5B illustrates a flow chart for showing a method for programming a resistive change element using an electrical stimulus formed by a first voltage waveform that oscillates around a first voltage and a second voltage that has a substantially constant voltage level.

DETAILED DESCRIPTION

Figure 1:
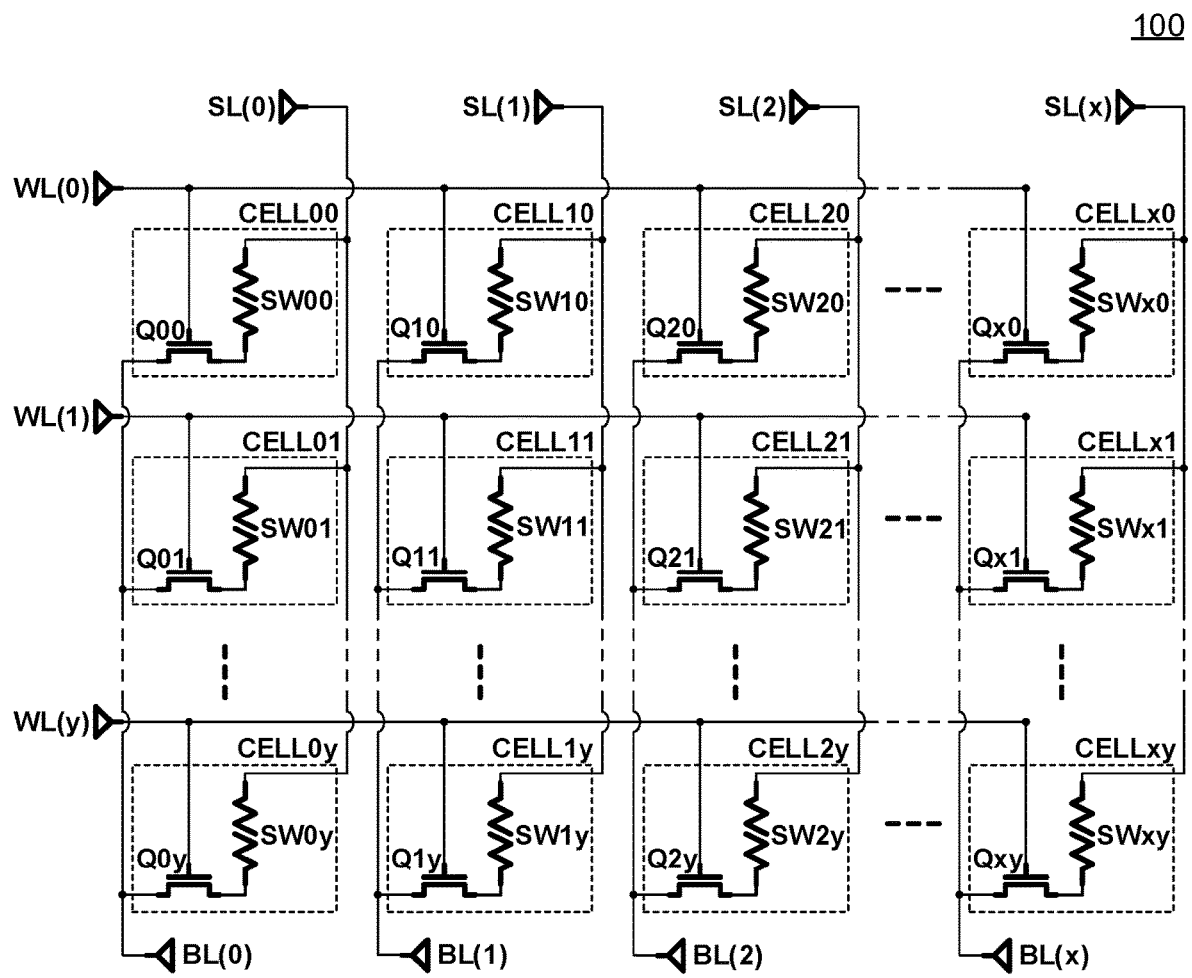
FIG. 1 illustrates a 1T1R resistive change element array.

The present disclosure relates to devices and methods for programming resistive change elements using an electrical stimulus having a voltage greater than a steady state voltage. The devices and methods of the present disclosure apply an electrical stimulus having a voltage greater than a steady state voltage to a resistive change element cell to adjust a resistive state of the resistive change element. The devices and methods of the present disclosure generate a voltage waveform having a voltage greater than a steady state voltage using inductances, capacitances, and a current stimulus. The devices and methods of the present disclosure transmit part of the voltage waveform to a resistive change element cell. The part of the voltage waveform transmitted to the resistive change element cell is the electrical stimulus.

Resistive change memory cells, such as 1T1R cells, 1D1R cells, and 1-R cells, store information through the use of a resistive change element within the cell. Responsive to electrical stimulus, the resistive change element can be adjusted between at least two non-volatile resistive states. Typically, two resistive states are used: a low resistive state (corresponding, typically, to a logic '1,' a SET state) and a high resistive state (corresponding, typically, to a logic '0,' a RESET state). In this way, the resistance value of the resistive change element within the resistive change memory cell can be used to a store a bit of information (functioning, for example, as a 1-bit memory element). According to other aspects of the present disclosure, more than two resistive states are used, allowing a single cell to store more than one bit of information. For example, a resistive change memory cell might adjust its resistive change element between four non-volatile resistive states, allowing for the storage of two bits of information in a single cell. Resistance values corresponding with non-volatile resistive states are typically separated by an amount of resistance so that a non-volatile resistive state of a resistive change element can be determined during a READ operation. For example, a resistive change element can have a low resistive state (corresponding, typically, to a logic '1,' a SET state) corresponding with a resistance value on the order of 1 M$\Omega$, and a high resistive state (corresponding, typically, to a logic '0,' a RESET state) corresponding with a resistance value on the order of 10 M$\Omega$.

A resistive change element is adjusted (programmed) between at least two non-volatile resistive states by applying electrical stimuli across the resistive change element. A PROGRAMMING operation of a resistive change element is an operation to adjust a resistive state of the resistive change element from an initial resistive state to a new desired resistive state. Programming operations can include a SET operation, where a resistive change element is adjusted from a relatively high resistive state (e.g., on the order of 1 M$\Omega$) to a relatively low resistive state (e.g., on the order of 20 k$\Omega$), and a RESET operation, where a resistive change element is adjusted from a relatively low resistive state (e.g., on the order of 20 k$\Omega$) to a relatively high resistive state (e.g., on the order of 1 M$\Omega$). Typically, a resistive change element is adjusted (programmed) between different resistive states by applying an electrical stimulus across the element. For example, one or more programming pulses of specific voltages, currents, and pulse widths (as required by the needs of a specific application) can be applied across a resistive change element to adjust the resistance of a resistive change element from an initial resistance to a new desired resistance. In the above example, another one or more programming pulses of specific voltages, currents, and pulse widths (as required by the needs of a specific application) can be applied across the resistive change element to adjust the resistive change element back to the initial resistance or, depending on the specific application, a third resistance. Further, as described in U.S. patent application Ser. No. 15/136,414, pulse trains can be applied across a resistive change element to adjust a resistance of the resistive change element.

Resistive change elements (and arrays thereof) are well suited for use as non-volatile memory devices for storing digital data (storing logic values as resistive states) within electronic devices (such as, but not limited to, cell phones, digital cameras, solid state hard drives, and computers). For example, resistive change elements can be used in a variety of types of resistive change memory cells, such as 1T1R resistive change memory cells, 1D1R resistive change memory cells, and 1-R resistive change memory cells. 1T1R resistive change memory cells include a transistor to provide a selectability function for that cell and a resistive change element. 1D1R resistive change memory cells include a diode to provide a selectability function for that cell and a resistive change element. 1-R resistive change memory cells, also referred to as nR resistive change memory cells, include a resistive change element and do not include an in situ selection device or other current limiting device. However, the use of resistive change elements is not limited to memory applications. Resistive change elements (and arrays thereof) are also well suited for use as switches, reprogrammable fuses, and antifuses. Further, resistive change elements and (arrays thereof) are well suited for use in a variety of devices such as memory devices, routing devices, logic devices, including programmable logic devices such as FPGAs, sensor devices, and analog circuits.

The terms connected, coupled, electrically connected, electrically coupled, and in electrical communication are used interchangeably in this disclosure and the terms refer to a connection that allows electrical signals to flow either directly or indirectly from one component to another. The direct flow of electrical signals from one component to another does not preclude intervening passive devices that do not generate electric energy such as resistor, capacitors, and inductors. The indirect flow of electrical signals from one component to another does not preclude intervening active devices such as transistors or flow of electrical signals by electromagnetic induction. Additionally, the terms terminal, contact, and conductor are used interchangeably in this disclosure. Further, the terms bit line and word line are not limited to referring to the array lines designated below, but rather, the terms bit line and word line can be used to refer to array lines that differ from the designations below.

Referring now to FIG. 1, an exemplary architecture for a resistive change element array 100 is illustrated in a simplified schematic diagram. The resistive change element array 100 includes a plurality of resistive change element cells CELL00-CELLxy, each resistive change element cell including a resistive change element SW00-SWxy and an in situ selection device Q00-Qxy. Each resistive change element cell CELL00-CELLxy is accessed for programming operations, reading operations, set verify operations, and reset verify operations using three array lines (a bit line, a source line, and a word line).

The resistive change elements SW00-SWxy can be two-terminal nanotube switching elements, phase change memory elements, metal oxide memory elements, or conductive bridge memory elements as well as other materials and designs. The resistive change elements SW00-SWxy can be formed from a plurality of materials, such as, but not limited to, metal oxide, solid electrolyte, phase change material such as a chalcogenide glass, graphene fabrics, and carbon nanotube fabrics. For example, U.S. Pat. No. 7,781,862 to Bertin et al., discloses a two-terminal nanotube switching device comprising first and second conductive terminals and a nanotube fabric article. Bertin teaches methods for adjusting the resistivity of the nanotube fabric article between a plurality of nonvolatile resistive states. In at least one embodiment, electrical stimulus is applied to at least one of the first and second conductive elements such as to pass an electric current through the nanotube fabric layer. By carefully controlling this electrical stimulus within a certain set of predetermined parameters (as described by Bertin in U.S. Pat. No. 7,781,862) the resistivity of the nanotube article can be repeatedly switched between a relatively high resistive state and a relatively low resistive state. In certain embodiments, these high and low resistive states can be used to store a bit of information.

Each resistive change element SW00-SWxy is programmable into a low resistive state, for example a resistance on the order of 20 k$\Omega$ (corresponding, typically, to a logic '1,' a SET state), and a high resistive state, for example a resistance on the order of 1 MO (corresponding, typically, to a logic '0,' a RESET state). While some examples of resistive change element cells and resistive change elements within the present disclosure specifically reference carbon nanotube based resistive change element cells and resistive change elements, the devices and methods of the present disclosure are not limited in this regard. Indeed, it will be clear to those skilled in the art that the devices and methods of the present disclosure are applicable to any type of resistive change element cell or resistive change element (such as, but not limited to, phase change and metal oxide).

The in situ selection devices Q00-Qxy are n-channel metal oxide semiconductor field effect transistors (MOSFETs), also referred to as NMOS transistors. Alternatively, the in situ selection devices Q00-Qxy can be other types of field effect transistors, such as carbon nanotube field effect transistors (CNTFETs), SiGE FETs, fully-depleted silicon-on-insulator FETs, or multiple gate field effect transistors such as FinFETs. When field effect transistors that do not require a semiconductor substrate are used with nanotube based resistive change elements, this enables chips fabricated entirely on insulator material, and additionally, enables the resistive change element array to be stacked to reduce the amount of chip area consumed by the resistive change element array.

Each resistive change element SW00-SWxy has a first terminal and a second terminal. Each in situ selection device Q00-Qxy has a drain terminal, a source terminal, and a gate terminal. The first terminals of the resistive change elements SW00-SWxy are electrically connected to source lines SL(0)-SL(x) and the second terminals of the resistive change elements SW00-SWxy are electrically connected to drain terminals of the in situ selection devices Q00-Qxy. The drain terminals of the in situ selection devices Q00-Qxy are electrically connected to second terminals of the resistive change elements SW00-SWxy, the source terminals of the in situ selection devices Q00-Qxy are electrically connected to the bit lines BL(0)-BL(x), and the gate terminals of the in situ selection devices Q00-Qxy are electrically connected to the word lines WL(0)-WL(y).

Figure 2:
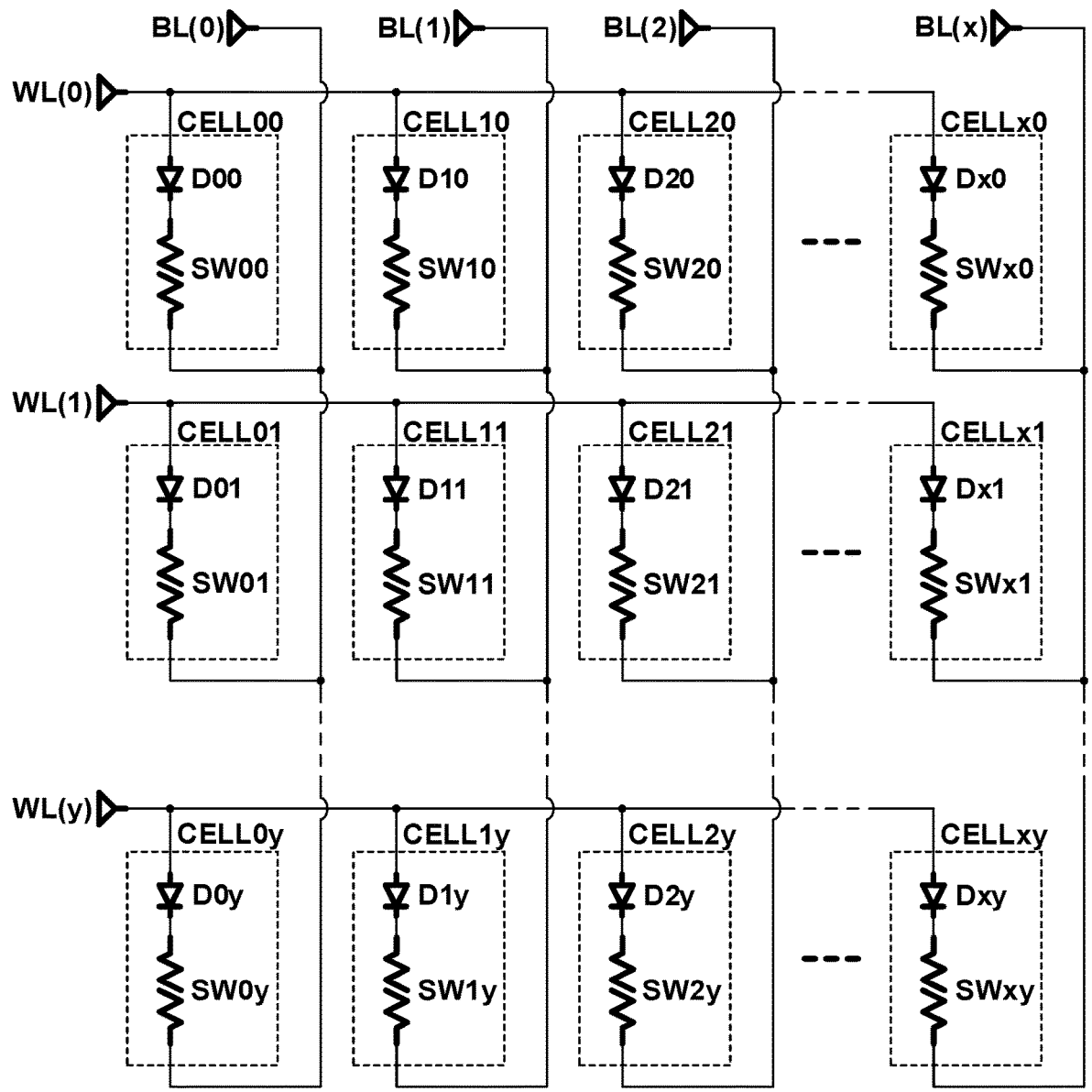
FIG. 2 illustrates a 1D1R resistive change element array.

Referring now to FIG. 2, an exemplary architecture for a 1D1R resistive change element array is illustrated in a simplified schematic diagram. The resistive change element array 200 comprises a plurality of resistive change element cells CELL00-CELLxy, each cell resistive change element including a resistive change element SW00-SWxy and an in situ selection device.

The in situ selection devices are diodes used within each resistive change element cell to provide a selectability function for that cell. That is, the diode devices D00-Dxy provide a means to access a desired resistive change element while isolating unselected elements. Each diode device has an anode terminal and a cathode terminal. Each resistive change element SW00-SWxy has a first terminal and a second terminal. An anode terminal of each diode device D00-Dxy is respectively electrically connected to a word line WL(0)-WL(y) and a cathode terminal of each diode device D00-Dxy is respectively electrically connected to a first terminal of a resistive change element SW00-SWxy. A second terminal of each resistive change element SW00-SWxy is respectively electrically connected to a bit line BL(0)-BL(x). The resistive change elements can be two-terminal nanotube switching elements, phase change memory elements, metal oxide memory elements, or conductive bridge memory elements as well as other materials and designs. The individual array cells CELL00-CELLxy within resistive change element array 200 are accessed for programming operations, reading operations, set verify operations, and reset verify operations using word lines WL(0)-WL(y) and bit lines BL(0)-BL(x).

Figure 3:
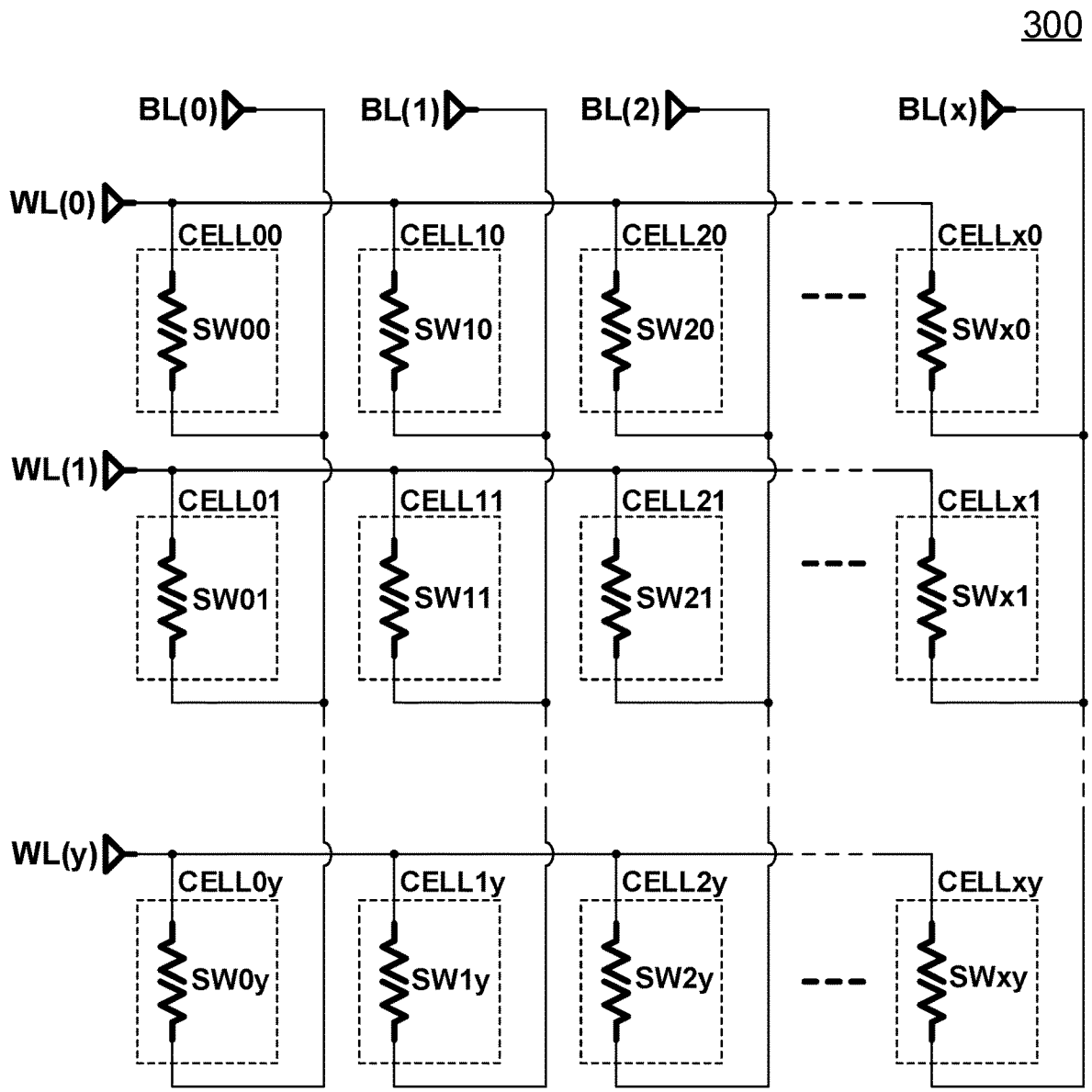
FIG. 3 illustrates a 1-R resistive change element array.

Referring now to FIG. 3, an exemplary architecture for a 1-R resistive change element array is illustrated in a simplified schematic diagram. The 1-R resistive change element array 300 comprises a plurality of resistive change element cells CELL00-CELLxy, and each resistive change element cell includes a resistive change element SW00-SWxy and does not include an in situ selection device or other current limiting element. The resistive change element cells CELL00-CELLxy are referred to as 1-R resistive change element cells because the resistive change element cells include a resistive change element and do not include an in situ selection device or other current limiting element. Additionally, the 1-R resistive change element array 300 is referred to as a 1-R resistive change element array because the resistive change element array 300 includes 1-R resistive change element cells. Each array cell CELL00-CELLxy within resistive change element array 300 is accessed for programming operations, reading operations, set verify operations, and reset verify operations using two array lines (a word line and a bit line).

Each resistive change element SW00-SWxy has a first terminal respectively electrically connected to a word line WL(0)-WL(y) and a second terminal respectively electrically connected to a bit line BL(0)-BL(y). The resistive change elements can be two-terminal nanotube switching elements, phase change memory elements, metal oxide memory elements, or conductive bridge memory elements as well as other materials and designs.

Figure 4A:
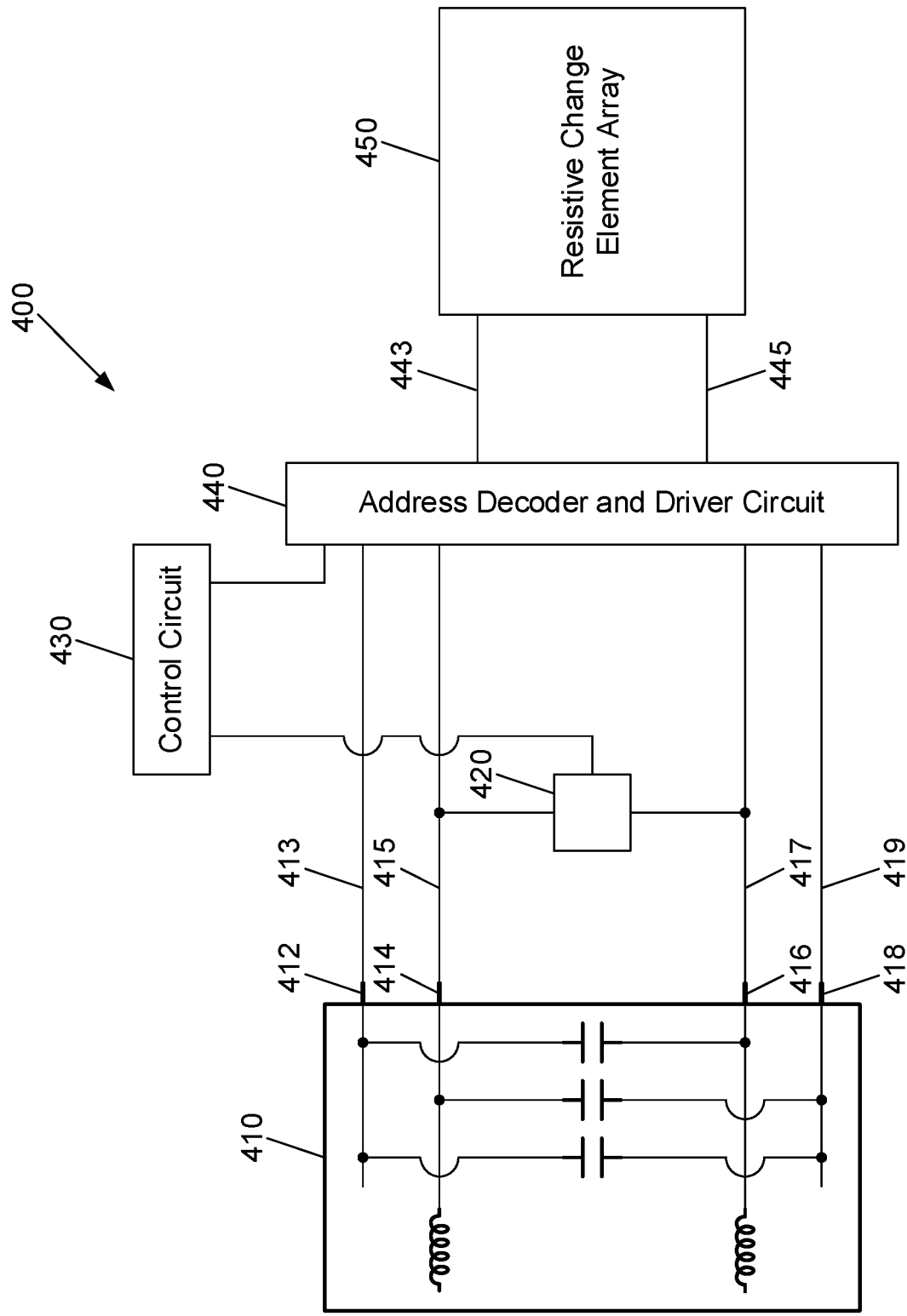
FIG. 4A illustrates a simplified schematic diagram of a resistive change element array having a power supply with a second output configured for generating a voltage waveform electrically connected to a Vpp_Write line and a third output configured for generation a voltage waveform electrically connected to a Vss_Write line.

Referring now to FIG. 4A, a simplified schematic diagram of a resistive change element device 400 having a power supply 410, a current stimulus circuit 420, a control circuit 430, an address decoder and driver circuit 440, and a resistive change element array 450 is illustrated. The resistive change element device 400 can program at least one resistive change element within at least one resistive change element cell in the resistive change element array 450 using an electrical stimulus having a voltage level greater than a steady state voltage level that can be supplied by the power supply 410. The resistive change element array 450 can be a 1T1R resistive change element array as discussed above with respect to FIG. 1, a 1D1R resistive change element array as discussed above with respect to FIG. 2, and a 1-R resistive change element array as discussed above with respect to FIG. 3, for example.

The power supply 410 has a first output 412, a second output 414, a third output 416, and a fourth output 418. The power supply 410 can supply a first system voltage Vpp on the first output 412, the first system voltage Vpp on the second output 414, a second system voltage Vss on the third output 416, and the second system voltage Vss on the fourth output 418. The first output 412 is electrically connected to a Vpp line 413, the second output 414 is electrically connected to a Vpp_Write line 415, the third output 416 is electrically connected to a Vss_Write line 417, and the fourth output 418 is electrically connected to a Vss line 419. It is noted that although the first system voltage Vpp is discussed below as having a voltage level of 2.5 volts, the first system voltage Vpp is not limited to having a voltage level of 2.5 volts and that a circuit designer can select other voltage levels for the first system voltage Vpp, such as a voltage level greater than 2.5 volts and a voltage level less than 2.5 volts. It is also noted that although the second system voltage Vss is discussed below as having a voltage level of 0 volts or ground, the second system voltage Vss is not limited to having a voltage level of 0 volts or ground and that a circuit designer can select other voltage levels for the second system voltage Vss, such as a voltage level greater than 0 volts and a voltage level less than 0 volts.

Figure 4C:
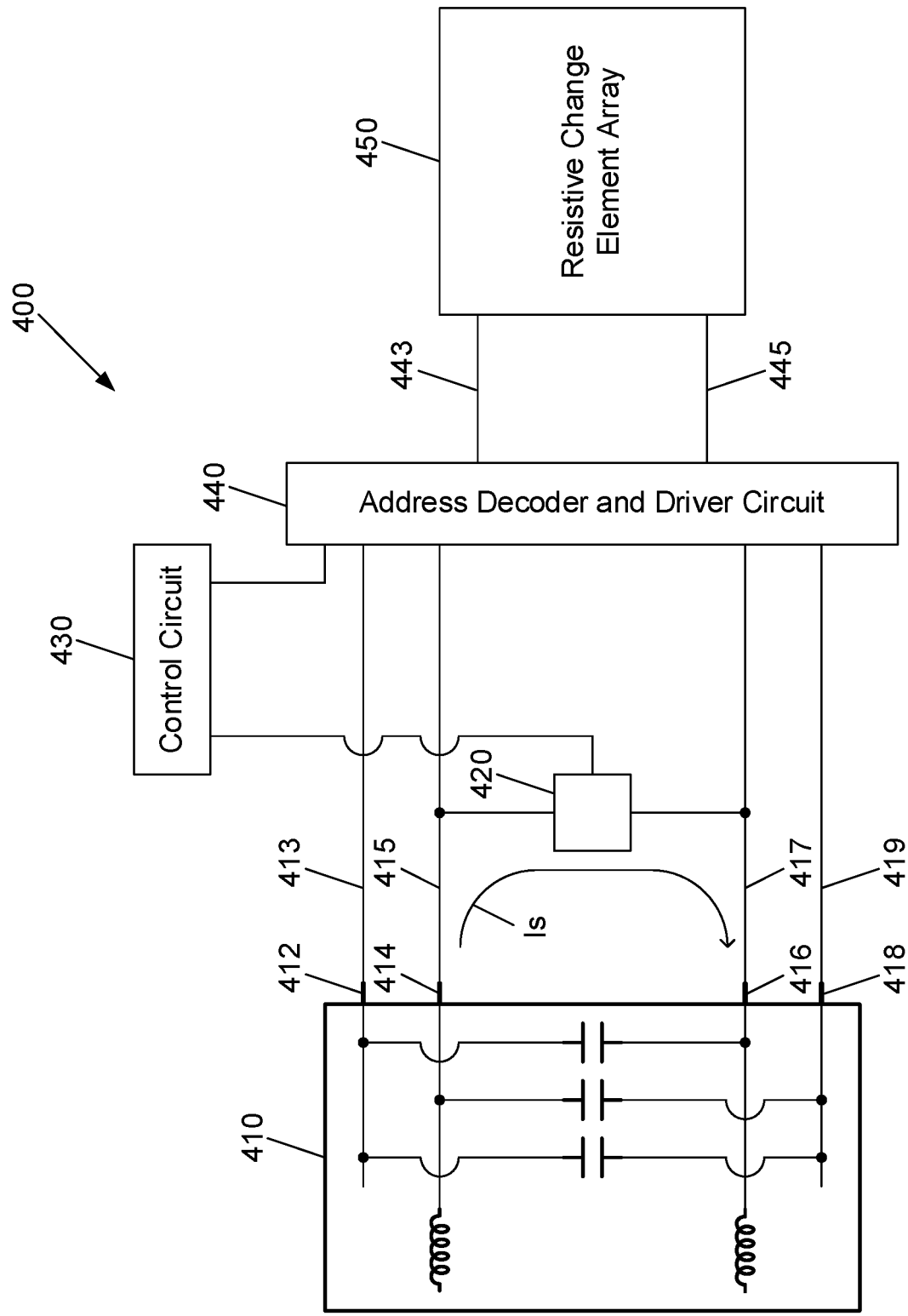
FIG. 4C illustrates a simplified schematic diagram showing current flow through the current stimulus circuit in the resistive change element array of FIG. 4A.
Figure 4D:
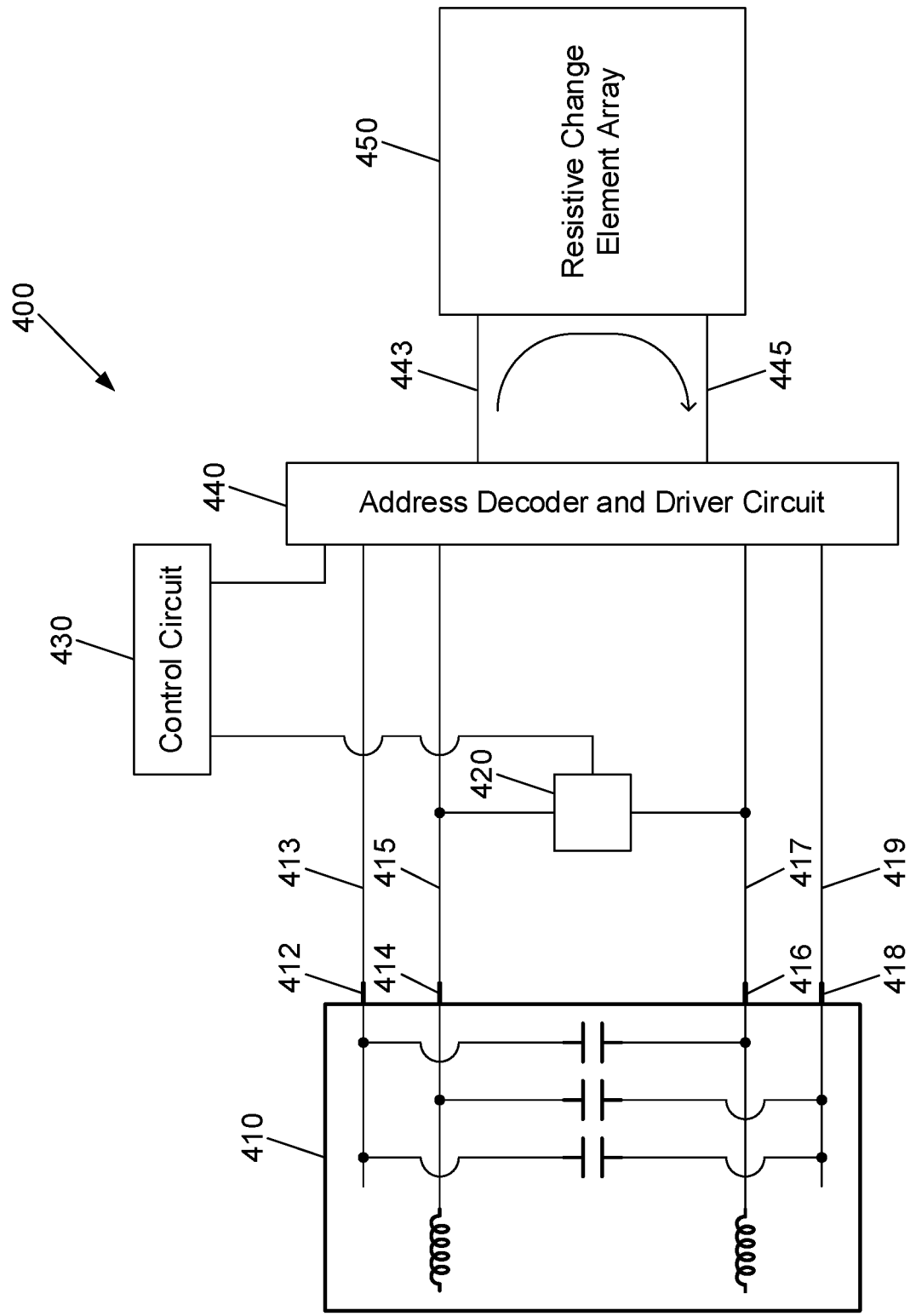
FIG. 4D illustrates a simplified schematic diagram showing current flow through a resistive change element cell in the resistive change element array of FIG. 4A.

Each of the first output 412, the second output 414, the third output 416, and the fourth output 418 have an output inductance and an output capacitance. FIGS. 4A and 4C-4D visually illustrate an output capacitance associated with the first output 412 and the fourth output 418 and output inductances and output capacitances associated with the second output 414 and the third output 416. The output capacitance associated with the first output 412 and the fourth output 418 and the output inductances and the output capacitances associated with the second output 414 and the third output 416 are not separate components but rather are inductances and capacitances associated with other components, packaging, and/or electrical connections. For example, the output inductances and the output capacitances can be formed by the internal circuitry of the power supply 410, the packaging of the power supply 410, and/or the external connections of the power supply 410. The output inductances and the output capacitances are shown in FIGS. 4A and 4C-4D for the purpose of explaining programming at least one resistive change element within at least one resistive change element cell in the resistive change element array 450 using an electric stimulus having a voltage level greater than a steady state voltage level that can be supplied by the power supply 410.

The output inductances and the output capacitances associated with the first output 412, the second output 414, the third output 416, and the fourth output 418 are design variables selected by a circuit designer. The output inductances and the output capacitances associated with the second output 414 and the third output 416 are design variables selected by a circuit designer for generating voltage waveforms in response to a change in current flow on the Vpp_Write line 415 and the Vss_Write line 419. The voltage waveform produced from the second output 414 rings or oscillates around the first system voltage Vpp and the voltage waveform produced from the third output 416 rings or oscillates around the second system voltage Vss. Additionally, the voltage waveform produced from the second output 414 and the voltage waveform produced from the third output 416 are out of phase so that a voltage waveform across the Vpp_Write line 415 and the Vss_Write line 419 has at least one part with a voltage level greater than a difference between the first system voltage Vpp and the second system voltage Vss. For example, when the first system voltage Vpp is 2.5 volts and the second system voltage Vss is 0 volts or ground, the output inductances and the output capacitances associated with the second output 414 and the third output 416 are selected such that a voltage waveform produced from the second output 414 rings or oscillates around 2.5 volts, a voltage waveform produced from the third output 416 rings or oscillates around 0 volts, and the voltage waveform produced from the second output 414 and the voltage waveform produced from the third output 416 are out of phase so that a voltage waveform across the Vpp_Write line 415 and the Vss_Write line 419 has a least one part with a voltage level greater than 2.5 volts.

The current stimulus circuit 420 creates a current path from the Vpp_Write line 415 to the Vss_Write line 417 based on a signal from the control circuit 430. The current stimulus circuit 420 has a switch such as a field effect transistor (FET), such as Metal Oxide Silicon Field Effect Transistor (MOSFET), carbon nanotube field effect transistor (CNTFET), SiGE FETs, fully-depleted silicon-on-insulator FET, and a multiple gate field effect transistor such as FinFET. The amount of current flowing from the Vpp_Write line 415 to the Vss_Write line 417 through the current stimulus circuit 420 can be regulated by the signal supplied by the control circuit 430 and/or the current carrying capacity of the switch in the current stimulus circuit 420. Additionally, the current stimulus circuit 420 can have at least one other component for regulating current flow, such as a resistor and a current source, electrically connected to the switch to regulate current flow from the Vpp_Write line 415 to the Vss_Write line 417. The control circuit 430 can be a processor, a controller, a programmable logic device, and a field programmable gate array (FGPA).

The current stimulus circuit 420 has a first terminal, a second terminal, and a third terminal. The first terminal is electrically connected to the Vpp_Write line 415, the second terminal is electrically connected to the Vss_Write line 417, and the third terminal is electrically connected to the control circuit 430. For example, when the current stimulus circuit 420 has an n-channel MOSFET, also referred to as a NMOS transistor, the drain terminal of the NMOS transistor is electrically connected to the Vpp_Write line 415, the source terminal of the NMOS transistor is electrically connected to the Vss_Write line 417, and the gate terminal of the NMOS transistor is electrically connected to the control circuit 430. Further, in the above example, where the current stimulus circuit 420 has an NMOS transistor, the current stimulus circuit 420 can additionally have a fourth terminal corresponding to a body terminal of the NMOS transistor and the body terminal of the NMOS transistor can be electrically connected to the Vss line 419. Alternatively, the current stimulus circuit 420 can be omitted from the resistive change element device 400 when a PROGRAMMING operation of at least one resistive change element within at least one resistive change element cell in the resistive change element array 450 creates a desired change in current flow on the Vpp_Write line 415 and the Vss_Write line 417. For example, a PROGRAMMING OPERATION of all resistive change elements with all cells on a word line at the same time, also referred to as page mode PROGRAMMING OPERATION, draws a large amount of current that can create a desired change in current flow on the Vpp_Write line 415 and the Vss_Write line 417.

The address decoder and driver circuit 440 electrically connects at least one resistive change element cell in the resistive change element array 450 to the Vpp_Write line 415 and the Vss_Write line 417 based on signals from the control circuit 430. The address decoder and driver circuit 440 is electrically connected to the Vpp line 413, the Vpp_Write line 415, the Vss_Write line 417, the Vss line 419, a $V_{TE}$ line 443, a $V_{BE}$ line 445, and the control circuit 430. It is noted that the $V_{TE}$ line 443 can refer to a plurality of array lines in the resistive change element array 450 and the $V_{BE}$ 445 can refer to a plurality of array lines in the resistive change element array 450. It is further noted that when additional lines are used for selecting at least one resistive change element cell in the resistive change element array 450, such as when the resistive change element array 450 is a 1T1R resistive change element array, the address decoder and driver circuit 440 can be electrically connected to additional lines.

The address decoder and driver circuit 440 has a plurality of field effect transistors (FETs), such as Metal Oxide Silicon Field Effect Transistors (MOSFETs), carbon nanotube field effect transistors (CNTFETs), SiGE FETs, fully-depleted silicon-on-insulator FETs, and multiple gate field effect transistors such as FinFETs. The address decoder and driver circuit 440 can be designed such that the address decoder and driver circuit 440 clamps a maximum voltage on the Vpp_Write line 415 and a minimum voltage the Vss_Write line 417. For example, when the address decoder and driver circuit 440 has a first PMOS transistor with a drain terminal electrically connected to the $V_{TE}$ line 443, a source terminal electrically connected to the Vpp_Write line 415, a gate terminal electrically connected to receive a signal to turn on and off the first PMOS transistor, and a body terminal electrically connected to the Vpp line 413, and a first NMOS transistor with a drain terminal electrically connected to the $V_{TE}$ line 443, a source terminal electrically connected to the Vpp_Write line 415, a gate terminal electrically connected to receive a signal to turn on and off the first NMOS transistor, and a body terminal electrically connected to Vpp line 413, a maximum voltage on the Vpp_Write line 415 is clamped to a voltage level approximately one diode drop greater than the voltage level of the Vpp line 413. For example, when the address decoder and driver circuit 440 has a second PMOS transistor with a drain terminal electrically connected to the $V_{BE}$ line 445, a source terminal electrically connected to the Vss_Write line 417, a gate terminal electrically connected to receive a signal to turn on and off the second PMOS transistor, and a body terminal electrically connected to the Vss line 419, and a second NMOS transistor with a drain terminal electrically connected to the $V_{BE}$ line 445, a source terminal electrically connected to the Vss_Write line 417, a gate terminal electrically connected to receive a signal to turn on and off the second NMOS transistor, and a body terminal electrically connected to Vss line 419, a minimum voltage on the Vss_Write line 417 is clamped to a voltage level approximately one diode drop less than the voltage level of the Vss line 413. It is noted that voltages clamped using body diodes differ from voltages clamped using ideal diodes because characteristics of body diodes differ from characteristics of ideal diodes.

Alternatively, the address decoder and driver circuit 440 can be designed such that the address decoder and driver circuit 440 does not clamp a maximum voltage on the Vpp_Write line 415 and a minimum voltage the Vss_Write line 417. For example, when the address decoder 440 has a first PMOS transistor with a drain terminal electrically connected to the $V_{TE}$ line 443, a source terminal electrically connected to the Vpp_Write line 415, a gate terminal electrically connected to receive a signal to turn on and off the first PMOS transistor, and a body terminal electrically connected to the Vpp_Write line 415, and a first NMOS transistor with a drain terminal electrically connected to the $V_{TE}$ line 443, a source terminal electrically connected to the Vpp_Write line 415, a gate terminal electrically connected to receive a signal to turn on and off the first NMOS transistor, and a body terminal electrically connected to Vpp_Write line 413, the address decoder and driver circuit 440 does not clamp a maximum voltage on the Vpp_Write line 415. For example, when the address decoder and driver circuit 440 has a second PMOS transistor with a drain terminal electrically connected to the $V_{BE}$ line 445, a source terminal electrically connected Vss_Write line 417, a gate terminal electrically connected to receive a signal to turn on and off the second PMOS transistor, and a body terminal electrically connected to the Vss_Write line 417, and a second NMOS transistor with a drain terminal electrically connected to the $V_{BE}$ line 445, a source terminal electrically connected to the Vss_Write line 417, a gate terminal electrically connected to receive a signal to turn on and off the second NMOS transistor, and a body terminal electrically connected to Vss_Write line 417, the address decoder and driver circuit 440 does not clamp a minimum voltage on the Vss_Write line 417.

A PROGRAMMING operation of a resistive change element is discussed below with respect to FIGS. 4B-4D. FIG. 4B illustrates a flow chart 460 showing a method for programming a resistive change element. The method starts in step 462 with generating a first voltage waveform and a second voltage waveform in response to a current stimulus, where the first voltage waveform oscillates around a first voltage and the second voltage waveform oscillates around a second voltage. The method continues in step 464 with transmitting at least part of the first voltage waveform and at least part of the second voltage waveform to a resistive change element to apply an electrical stimulus across the resistive change element, where the electrical stimulus has a voltage greater than a difference between the first voltage and the second voltage. The electrical stimulus can have one or more programming pulses of specific voltages, currents, pulse widths, and pulse shapes. The specific voltages, currents, pulse widths, and pulse shapes of the one or more programming pulses can be adjusted as required by the needs of a specific application. Alternatively, the electrical stimulus is a pulse train made up of a series of sub-pulses applied in immediate and rapid succession across a resistive change element. The specific voltage, current, duty cycle, frequency, and length of time of pulse trains can be adjusted as required by the needs of a specific application. Additionally, the specific voltages, currents, pulse widths, and pulse shapes, of the sub-pulses can be separately adjusted as required by the needs of a specific application.

A circuit designer can adjust electrical characteristics of the electrical stimulus by adjusting the electrical characteristics, such as amplitude, frequency, phase, and rate of attenuation, of the first voltage waveform and second voltage waveform. For example, the electrical characteristics of the first voltage waveform and the second voltage waveform can be adjusted by adjusting the size of the output inductances of the second output 414 and the third output 416, adjusting the size of the output capacitances of the second output and the third output 416, electrically connecting at least one inductor to the Vpp_Write line and at least one inductor to the Vss_Write line, electrically connecting at least one capacitor to the Vpp_Write line and at least one capacitor to the Vss_Write line, and adjusting a characteristic of at least one component of the current stimulus circuit 420 to adjust the rate of change of current flow on the Vpp_Write line 415 and Vss_Write line 417.

Additionally, the circuit designer can adjust electrical characteristics of the electrical stimulus by adjusting the signals supplied to the current stimulus circuit 420 and the address decoder and driver circuit 440. For example, the circuit designer can have the control circuit 430 supply a single pulse to the current stimulus circuit 420 to create a current stimulus having a single current spike or the circuit designer can have the control circuit 430 supply a square wave to the current stimulus circuit to create a current stimulus having a plurality of current spikes. For example, the circuit designer can have the control circuit 430 supply a signal to the address decoder and driver circuit 440 to select the parts of the first voltage waveform and the second voltage waveform transmitted to the resistive change element cell by controlling when the resistive change element cell is electrically connected to the Vpp_Write line 415 and the Vss_Write line 417. It is noted that a current spike refers to a large amount of current flowing for a small amount of time. It is further noted that the first voltage and the second voltage are design variables that can be selected by the circuit designer.

Generating a first voltage waveform and a second voltage waveform in response to a current stimulus, where the first voltage waveform oscillates around a first voltage and the second voltage waveform oscillates around a second voltage, as similarly discussed above in step 462 of flow chart 460, is carried out by turning on the current stimulus circuit 420 for a set amount of time and then turning off the current stimulus circuit 420. The current stimulus circuit 420 creates a current path from the Vpp_Write line 415 to the Vss_Write line 417 through the current stimulus circuit 420 for the set amount of time the current stimulus circuit 420 is turned on. The current stimulus circuit 420 to removes the current path from the Vpp_Write line 415 to the Vss_Write line 417 through the current stimulus circuit 420 when the current stimulus circuit 420 is turned off after the set amount of time. It is noted that the set amount of time the current stimulus circuit 420 is turned on is a design variable that can be adjusted by a circuit designer and the number of times the current stimulus circuit 420 is turned on and turn off is a design variable that can be adjusted by a circuit designer.

The current stimulus circuit 420 is turned on and turned off by a signal supplied by the control circuit 430. When the current stimulus circuit 420 is turned on the current stimulus circuit 420 to creates a current path from the Vpp_Write line 415 to the Vss_Write line 417 through the current stimulus circuit 420. The current path current path from the Vpp_Write line 415 to the Vss_Write line 417 through the current stimulus circuit 420 causes an amount of current flowing on the Vpp_Write line 415 to increase and an amount of current flowing on the Vss_Write 417 line to increase. FIG. 4C shows a current Is flowing from the Vpp_Write line 415 to the Vss_Write line 417 through the current stimulus circuit 420. A rate of change of the amount of current flowing on the Vpp_Write line 415 is positive because the amount of current flowing on the Vpp_Write line 415 is increasing and a rate of change of the amount of current flowing on the Vss_Write line 417 is positive because the amount of current flowing on the Vss_Write line 417 is increasing. The output inductance associated with the second output 414 of the power supply 410 resists the increasing amount of current flowing on the Vpp_Write line 415 and the output inductance associated with the second output 414 causes the voltage on the Vpp_Write line 415 to drop in response to the increasing amount of current flowing on the Vpp_Write line 415. For example, when a steady state voltage on the Vpp_Write line 415 is 2.5 volts, an increasing amount of current flowing on the Vpp_Write line 415 can cause the voltage on the Vpp_Write line 415 to decrease below 2.5 volts. The output inductance associated with the third output 416 of the power supply 410 resists the increasing amount of current flowing on the Vss_Write line 417 and the output inductance associated with the third output 416 causes the voltage on the Vss_Write line 417 to increase in response to the increasing amount of current flowing on the Vss_Write line 417. For example, when the steady state voltage on the Vss_Write line 417 is 0 voltage or ground, an increasing amount of current flowing on the Vss_Write line 417 can cause the voltage on the Vss_Write line 417 to increase above 0 volts or ground.

When the current stimulus circuit 420 is turned off after the set amount of time the current path from the Vpp_Write line 415 to the Vss_Write line 417 through the current stimulus circuit 420 is removed. Removing the current path current path from the Vpp_Write line 415 to the Vss_Write line 417 through the current stimulus circuit 420 causes the amount of current flowing on the Vpp_Write line 415 to decrease and an amount of current flowing on the Vss_Write line 417 to decrease. A rate of change of the amount of current flowing on the Vpp_Write line 415 is negative because the amount of current flowing on the Vpp_Write line 415 is decreasing and a rate of change of the amount of current flowing on the Vss_Write line 417 is negative because the amount of current flowing on the Vss_Write line 417 is decreasing. The output inductance associated with the second output 414 of the power supply 410 resists the decreasing amount of current flowing on the Vpp_Write line 415 and the output inductance associated with the second output 414 causes the voltage on the Vpp_Write line 415 to increase in response to the decreasing amount of current flowing on the Vpp_Write line 415. For example, when a steady state voltage on the Vpp_Write line 415 is 2.5 volts, a decreasing amount of current flowing on the Vpp_Write line 415 can cause the voltage on the Vpp_Write line 415 to increase above 2.5 volts. The output inductance associated with the third output 416 of the power supply 410 resists the decreasing amount of current flowing on the Vss_Write line 417 and the output inductance associated with the third output 416 causes the voltage on the Vss_Write line 417 to decrease in response to the decreasing amount of current flowing on the Vss_Write line 417. For example, when the steady state voltage on the Vss_Write line 417 is 0 voltage or ground, a decreasing amount of current flowing on the Vss_Write line 417 can cause the voltage on the Vss_Write line 417 to decrease below 0 volts or ground. The increased voltage on the Vpp_Write line 415 and the decreased voltage on the Vss_Write line 417 form a voltage waveform across the Vpp_Write line 415 and the Vss_Write line 417 having a part with a voltage greater than a steady state voltage level that can be supplied by the power supply 410. It is noted that the in response to a current stimulus having a single current spike the voltage on the Vpp_Write line 415 will oscillate around the first system voltage Vpp with amplitude of the voltage waveform attenuating over time and the voltage on the Vss_Write line 417 will oscillate around the second system voltage Vss with amplitude of the voltage waveform attenuating over time. It is also noted that in response to a current stimulus have a plurality of current spike, the voltage on the Vpp_Write line 415 will oscillate around the first system voltage Vpp with amplitude of the voltage waveform returning to approximately the maximum amplitude after each current spike and the voltage on the Vss_Write line 417 will oscillate around the second system voltage Vss with amplitude of the voltage waveform returning to approximately the maximum amplitude after each current spike.

Transmitting at least part of the first voltage waveform and at least part of the second voltage waveform to a resistive change element cell to apply an electrical stimulus to the resistive change element cell, where the electrical stimulus has a voltage greater than a difference between the first voltage and the second voltage, as similarly discussed above in step 464 of flow chart 460, is carried out by the address decoder and driver circuit 440 electrically connecting a resistive change element cell in the resistive change element array 450 to the Vpp_Write line 415 and the Vss_Write line 417 to apply a part of the voltage waveform formed across the Vpp_Write line 415 and the Vss_Write line 417 to the resistive change element cell. The address decoder and driver circuit 440 electrically connects a resistive change element cell in the resistive change element array 450 to the Vpp_Write line 415 and the Vss_Write line 417 based on signals supplied by the control circuit 430. FIG. 4D shows the electrical stimulus being applied to the resistive change element cell in the resistive change element array 450. It is noted that the timing of the signals supplied by the control circuit 430 to address decoder and driver circuit 440 and the current stimulus circuit 420 are arranged such that the electrical stimulus applied to the resistive change element cell has a voltage level greater than the steady state voltage level across the Vpp_Write line 415 and the Vss_Write line 417.

Figure 4E:
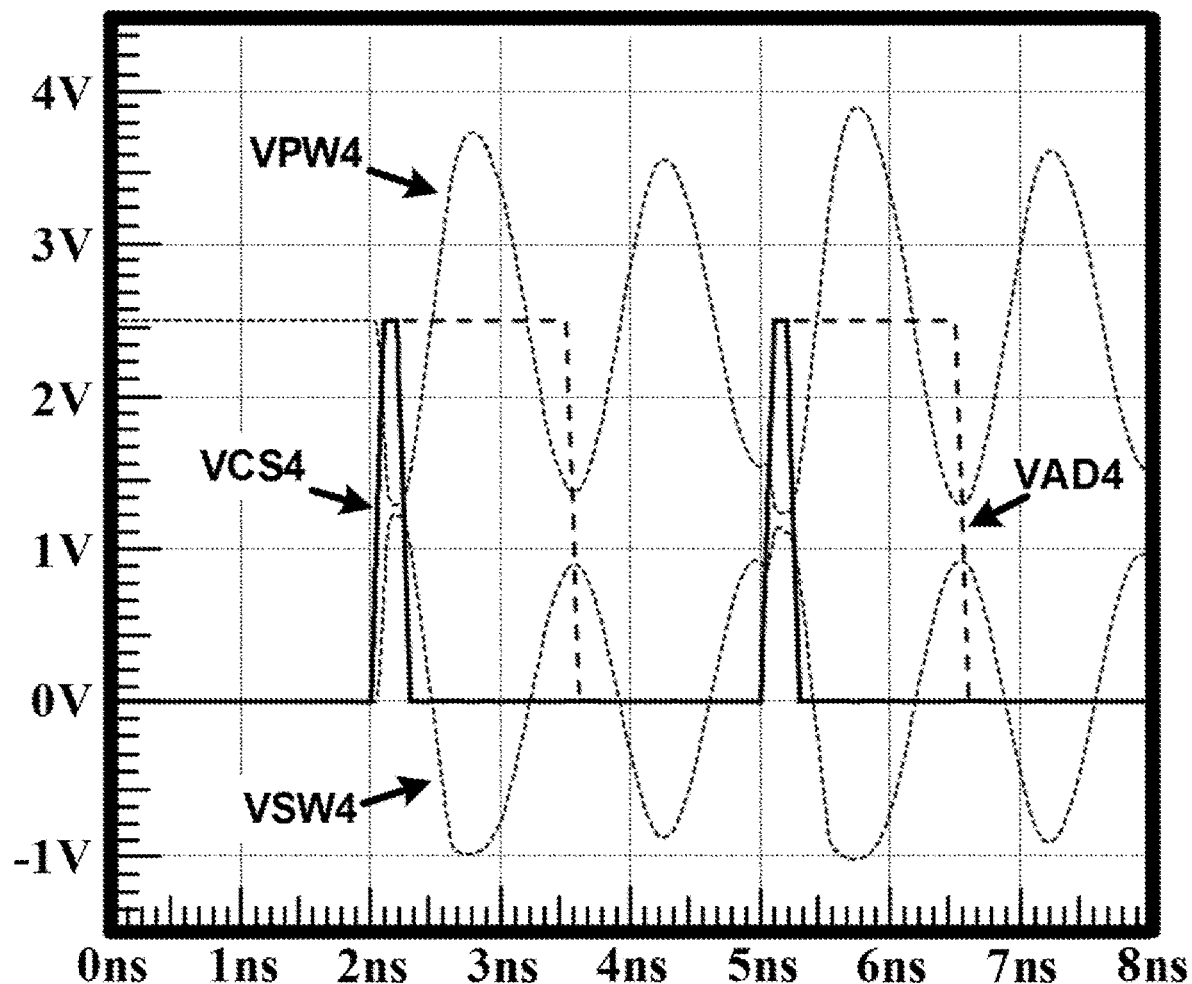
FIG. 4E illustrates voltage waveforms for during a simulated PROGRAMMING operation of a resistive change element cell in resistive change element array of FIG. 4A.
Figure 4F:
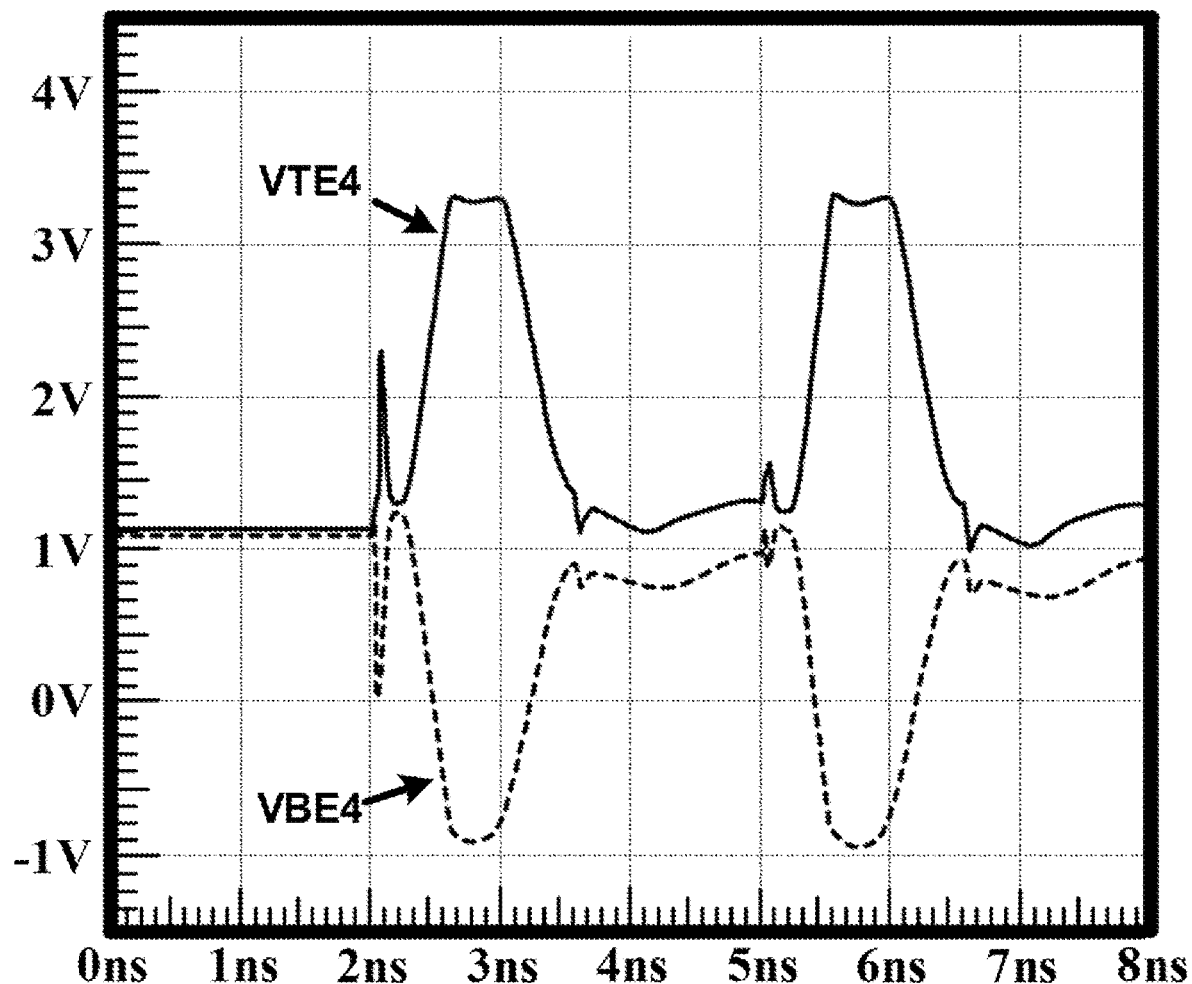
FIG. 4F illustrates voltage waveforms for forming an electrical stimulus during a simulated PROGRAMMING operation of a resistive change element cell in resistive change element array of FIG. 4A.
Figure 4G:
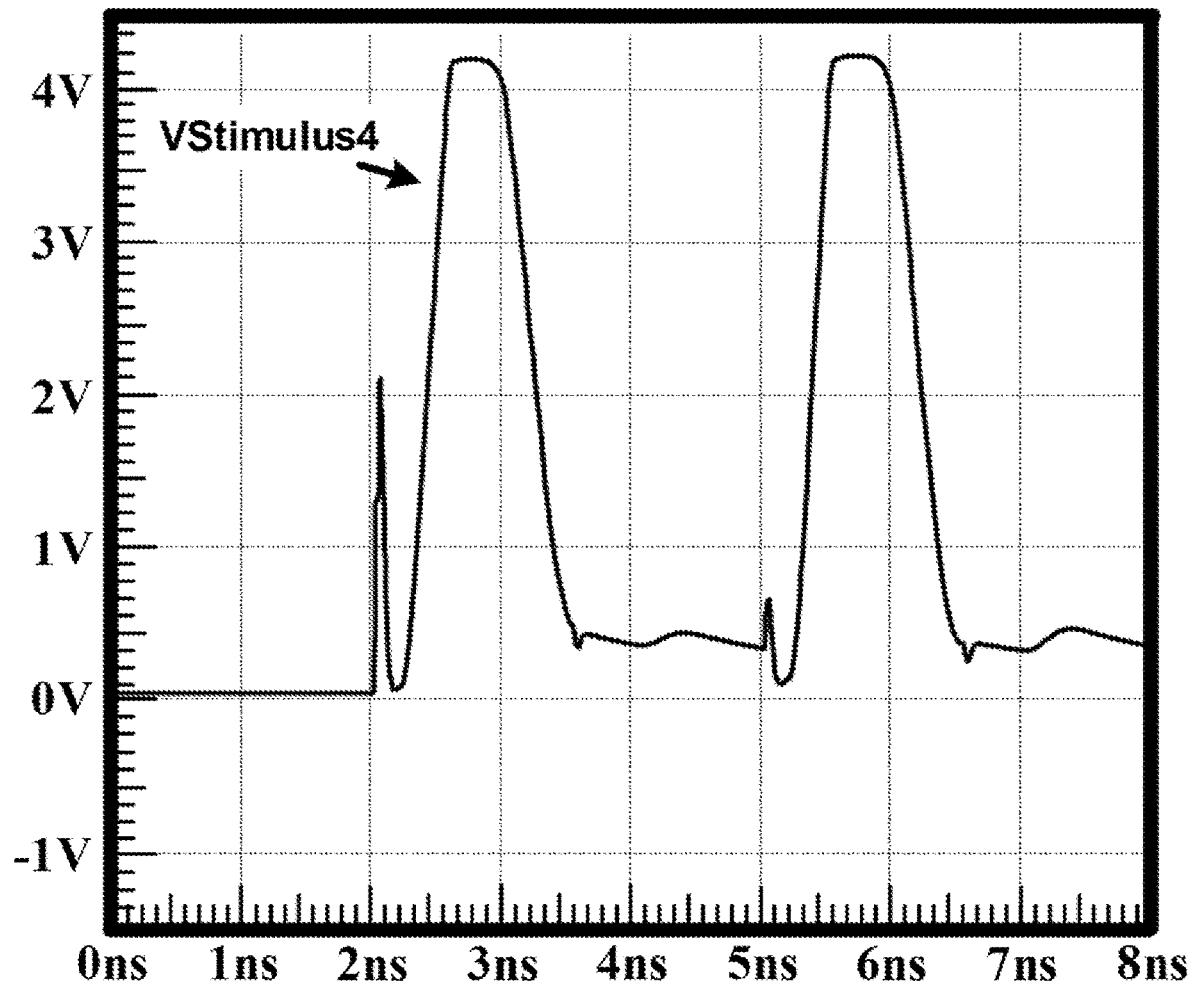
FIG. 4G illustrates a voltage waveform for an electrical stimulus during a simulated PROGRAMMING operation of a resistive change element cell in resistive change element array of FIG. 4A.

FIG. 4E illustrates a signal VCS4 supplied to the current stimulus circuit 420 by the control circuit 430, a signal VAD4 supplied to the address decoder and driver circuit 440 by the control circuit 430, a voltage waveform VPW4 on the Vpp_Write line 415 and a voltage waveform VSW4 on the Vss_Write line 417 during a simulated PROGRAMMING operation of a resistive change element in the resistive change element array of FIG. 4A. FIG. 4F illustrates a voltage waveform VTE4 and a voltage waveform VBE4 transmitted by the address decoder and driver circuit 440 based on the signal VAD4 supplied to the address decoder and driver circuit 440 by the control circuit 430. FIG. 4G illustrates an electrical stimulus Vstimulus4 applied to a resistive change element cell. It is noted that first system voltage Vpp is 2.5 volts and the second system voltage Vss is 0 volts for the simulated PROGRAMMING operation. It is also noted that the voltage waveform VPW4 on the Vpp_Write line 415 has a maximum voltage level clamped to a voltage level approximately one diode drop greater than the voltage level of the Vpp line 413 because the address decoder and driver circuit 440 for the simulated PROGRAMMING operation clamps a maximum voltage on the Vpp_Write line 415 to a voltage level approximately one diode drop greater than the voltage level of the Vpp line 413. It is also noted that the voltage waveform VSW4 on the Vss_Write line 417 has a minimum voltage level clamped to a voltage level approximately one diode drop less than the voltage level of the Vss line 419 because the address decoder and driver circuit 440 for the simulated PROGRAMMING operation clamps a minimum voltage on the Vss_Write line 417 to a voltage level approximately one diode drop less than the voltage level of the Vss line 419. It is further noted that the address decoder and driver circuit 440 can receive additional signals, such as address signals, from the control circuit 430, however, additional signals are not discussed for describing the simulated PROGRAMMING operation.

The signal VCS4 supplied to the current stimulus circuit 420, as shown in FIG. 4E, is a square wave having an amplitude of approximately 2.5 volts, a period of approximately 0.3 nanoseconds (ns), a frequency of approximately 333.3 MHz, and a duty cycle of approximately 8.3%. The signal VCS4 supplied to the current stimulus circuit 420 by the control circuit 430 turns on the current stimulus circuit 420 at approximately 2 ns, turns off the current stimulus circuit 420 at approximately 2.3 ns, turns on the current stimulus circuit 420 at approximately 5 ns, and turns off the current stimulus circuit 420 at approximately 5.3 ns. When the current stimulus circuit 420 is turned on the current stimulus circuit 420 creates a current path from the Vpp_Write line 415 to the Vss_Write line 417 through the current stimulus circuit 420 and when the current stimulus circuit is turned off the current stimulus circuit 420 removes the current path from the Vpp_Write line 415 to the Vss_Write line 417. Turning on and off the current stimulus circuit 420 twice creates a current stimulus having two current spikes. The voltage on the Vpp_Write line 415 changes from the steady state voltage of 2.5 volts and begins ringing or oscillating around the steady state voltage of 2.5 volts at approximately 2 ns in response to the current stimulus as shown in FIG. 4E. The voltage ringing or oscillating around the steady state voltage of 2.5 volts on the Vpp_Write line 515 attenuates over time after the first current spike, returns to approximately a maximum amplitude after the second current spike, and attenuates over time after the second current spike. The voltage on the Vss_Write line 417 changes from the steady state voltage of 0 volts and begins ringing or oscillating around the steady state voltage of 0 volts at approximately 2 ns in response to the current stimulus as shown in FIG. 4E. The voltage ringing or oscillating around the steady state voltage of 0 volts on the Vss_Write line 417 attenuates over time after the first current spike, returns to approximately a maximum amplitude after the second current spike, and attenuates over time after the second current spike.

The signal VAD4 supplied to the address decoder and driver circuit 440, as shown in FIG. 4E, is a square wave having an amplitude of approximately 2.5 volts, a period of approximately 3 nanoseconds (ns), a frequency of approximately 333.3 MHz, and a duty cycle of approximately 50%. The address decoder and driver circuit 440 transmits the voltage waveform on the Vpp_Write line 415 and the voltage waveform on the Vss_Write 417 from approximately 2 ns to approximately 3.6 ns and from approximately 5 ns to approximately 6.6 ns to a resistive change element cell in the resistive change element array 450 based on the signal VAD4 supplied by the control circuit 430. The address decoder and driver circuit 440 electrically connects the resistive change element cell to the Vpp_Write line 415 and the Vss_Write line 417 at approximately 2 ns, electrically disconnects the resistive change element cell from the Vpp_Write line 415 and the Vss_Write line 417 at approximately 3.6 ns, electrically connects the resistive change element cell to the Vpp_Write line 415 and the Vss_Write line 417 at approximately 5 ns, and electrically disconnects the resistive change element cell from the Vpp_Write line 415 and the Vss_Write line 417 at approximately 6.6 ns. FIG. 4F shows the voltage waveform VTE4 transmitted by the address decoder and driver circuit 440 from approximately 2 ns to approximately 3.6 ns and from approximately 5 ns to approximately 6.6 ns and the voltage waveform VBE4 transmitted by the address decoder and driver circuit 440 from approximately 2 ns to approximately 3.6 ns and from approximately 5 ns to approximately 6.6 ns. It is noted that shape of the voltage waveform VTE4 differs from the voltage waveform VPW4 on the Vpp_Write line 415 because the impedance of the Vpp_Write line 415 differs from the VTE line 443. It is also noted that shape of the voltage waveform VBE4 differs from the voltage waveform VSW4 on the Vss_Write line 417 because the impedance of the Vss_Write line 417 differs from the VBE line 445.

The electrical stimulus Vstimulus4, as shown in FIG. 4G has a first voltage pulse having a voltage of approximately 4.2 volts and a second voltage pulse having a voltage of approximately 4.2 volts. The first voltage pulse of the electrical stimulus is formed by the voltage waveform VPW4 on the Vpp_Write line 415 transmitted by the address decoder and driver circuit 440 from approximately 2 ns to approximately 3.6 ns and the voltage waveform VSW4 on the Vss_Write line 417 transmitted by the address decoder and driver circuit 440 from approximately 2 ns to approximately 3.6 ns. The second voltage pulse of the electrical stimulus is formed by the voltage waveform VPW4 on the Vpp_Write line 415 transmitted by the address decoder and driver 440 from approximately 5 ns to approximately 6.6 ns and the voltage waveform VSW4 on the Vss_Write line 417 transmitted by the address decoder and driver circuit 440 from approximately 5 ns to approximately 6.6 ns.

Figure 5A:
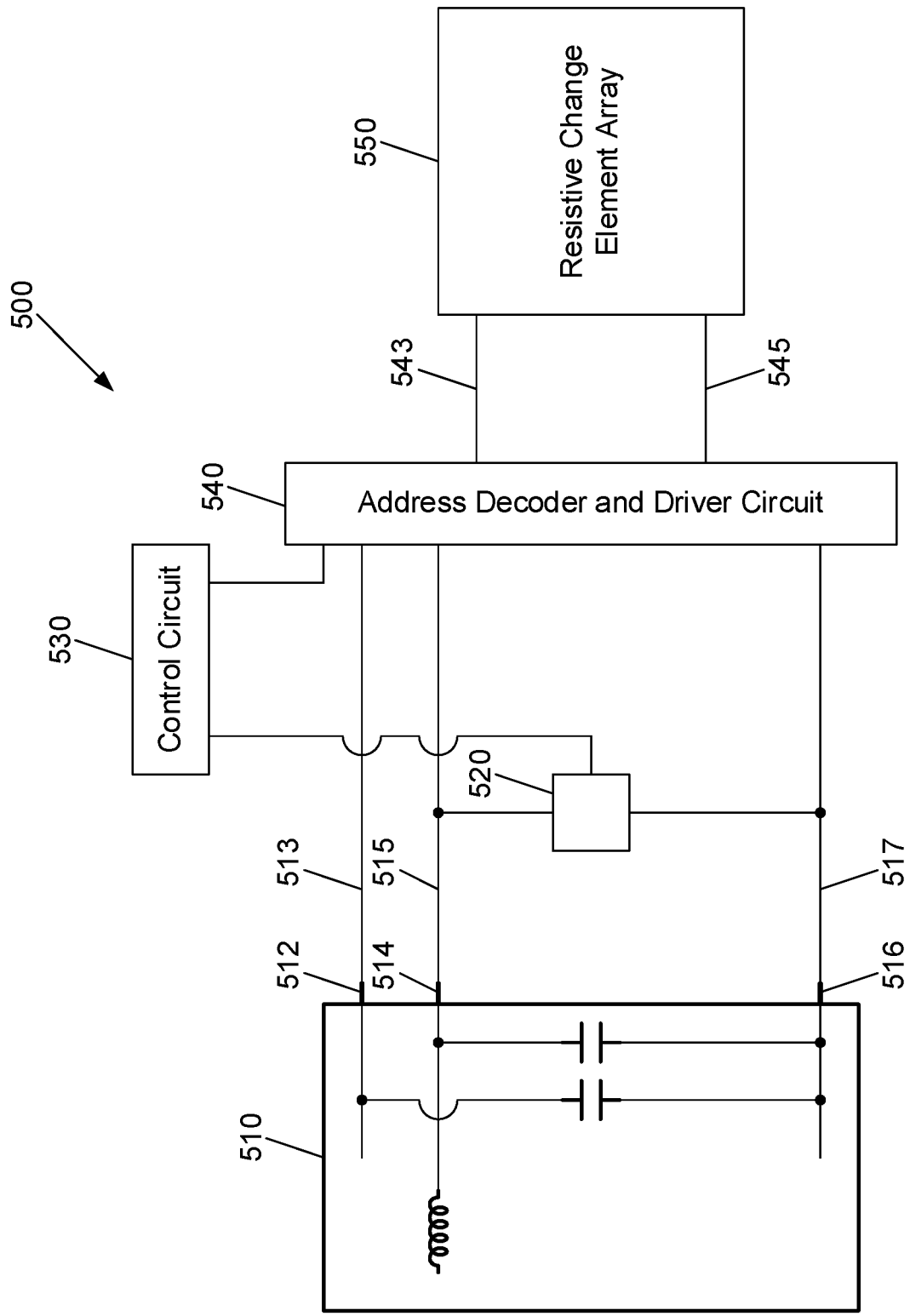
FIG. 5A illustrates a simplified schematic diagram of a resistive change element array having a power supply with a second output configured for generating a voltage waveform electrically connected to a Vpp_Write line.

Referring now to FIG. 5A, a simplified schematic diagram of a resistive change element device 500 having a power supply 510, a current stimulus circuit 520, a control circuit 530, an address decoder and driver circuit 540, and a resistive change element array 550 is illustrated. The resistive change element device 500 can program at least one resistive change element within at least one resistive change element cell in resistive change element array 550 using an electrical stimulus having a voltage level greater than a steady state voltage level that can be supplied by the power supply 510. The resistive change element array 550 can be a 1T1R resistive change element array as discussed above with respect to FIG. 1, a 1D1R resistive change element array as discussed above with respect to FIG. 2, and a 1-R resistive change element array as discussed above with respect to FIG. 3.

The power supply 510 has a first output 512, a second output 514, and a third output 516. The power supply 510 can supply a first system voltage Vpp on the first output 512, the first system voltage Vpp on the second output 514, and a second system voltage Vss on the third output 516. The first output 512 is electrically connected to a Vpp line 513, the second output 514 is electrically connected to a Vpp_Write line 515, and the third output 516 is electrically connected to a Vss line 517. It is noted that although the first system voltage Vpp is discussed below as having a voltage level of 2.5 volts, the first system voltage Vpp is not limited to having a voltage level of 2.5 volts and that a circuit designer can select other voltage levels for the first system voltage Vpp, such as a voltage level greater than 2.5 volts and a voltage level less than 2.5 volts. It is also noted that although the second system voltage Vss is discussed below as having a voltage level of 0 volts or ground, the second system voltage Vss is not limited to having a voltage level of 0 volts or ground and that a circuit designer can select other voltage levels for the second system voltage Vss, such as a voltage level greater than 0 volts and a voltage level less than 0 volts.

Figure 5C:
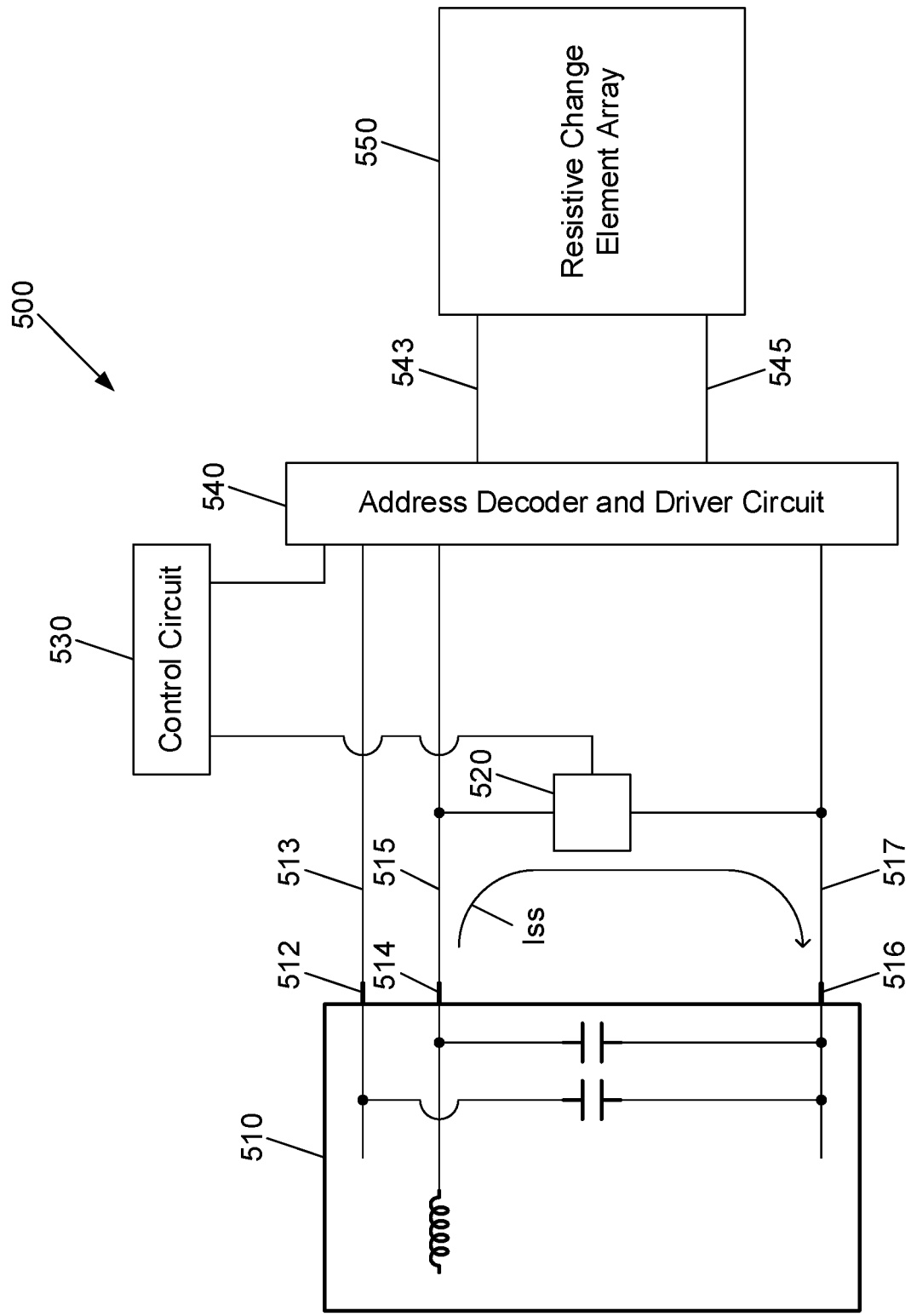
FIG. 5C illustrates a simplified schematic diagram showing current flow through the current stimulus circuit in the resistive change element array of FIG. 5A.
Figure 5D:
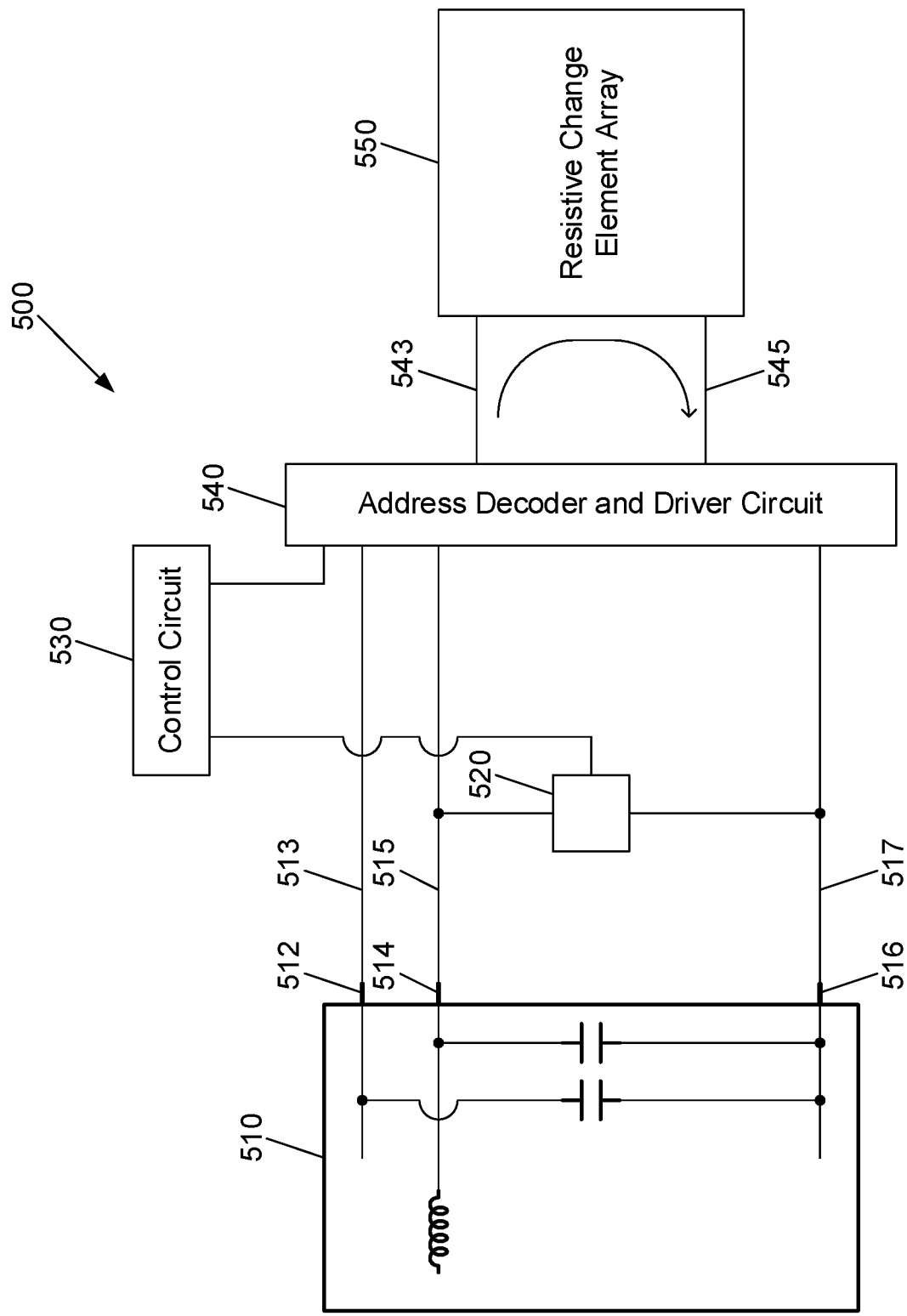
FIG. 5D illustrates a simplified schematic diagram showing current flow through a resistive change element cell in the resistive change element array of FIG. 5A.

Each of the first output 512, the second output 514, and the third output 516 have an output inductance and an output capacitance. FIGS. 5A and 5C-5D visually illustrate an output capacitance associated with the first output 512 and the third output 516 and an output inductance and an output capacitance associated with the second output 514. The output capacitance associated with the first output 512 and the third output 516 and the output inductance and the output capacitance associated with the second output 514 are not separate components but rather are inductances and capacitances associated with other components, packaging, and/or electrical connections. For example, the output inductances and the output capacitances can be formed by the internal circuitry of the power supply 510, the packaging of the power supply 510, and/or the external connections of the power supply 510. The output inductances and the output capacitances are shown in FIGS. 5A and 5C-5D for the purpose of explaining programming at least one resistive change element within at least one resistive change element cell in the resistive change element array 550 using an electric stimulus having a voltage level greater than a steady state voltage level that can be supplied by the power supply 510.

The output inductances and the output capacitances associated with the first output 512, the second output 514, and the third output 516 are design variables selected by a circuit designer. The output inductance and the output capacitance associated with the second output 514 are design variables selected by a circuit designer for a generating voltage waveform in response to a change in current flow on the Vpp_Write line 515. The voltage waveform produced from the second output 514 rings or oscillates around the first system voltage Vpp. The voltage produced from the third output 516 is substantially constant at the second system voltage Vss. It is noted that the voltage produced from the third output 516 can have small amount of noise and/or ringing or oscillating around the second system voltage Vss and still be considered substantially constant at the second system voltage Vss. For example, when the first system voltage Vpp is 2.5 volts and the second system voltage Vss is 0 volts or ground, the output inductance and the output capacitance associated with the second output 514 are selected such that a voltage waveform produced from the second output 514 rings or oscillates around 2.5 volts, the voltage produced from the third output 516 is substantially constant at 0 volts, and a voltage waveform across the Vpp_Write line 515 and the Vss line 517 has a least one part with a voltage level greater than 2.5 volts.

The current stimulus circuit 520 creates a current path from the Vpp_Write line 515 to the Vss line 517 based on a signal from the control circuit 530. The current stimulus circuit 520 has a switch such as a field effect transistor (FET), such as Metal Oxide Silicon Field Effect Transistor (MOSFET), carbon nanotube field effect transistor (CNT-FET), SiGE FETs, fully-depleted silicon-on-insulator FET, and a multiple gate field effect transistor such as FinFET. The amount of current flowing from the Vpp_Write line 515 to the Vss line 517 through the current stimulus circuit 520 can be regulated by the signal supplied by the control circuit 530 and/or the current carrying capacity of the switch in the current stimulus circuit 520. Additionally, the current stimulus circuit 520 can have at least one other component for regulating current flow, such as a resistor and a current source, electrically connected to the switch to regulate current flow from the Vpp_Write line 515 to the Vss line 517. The control circuit 530 can be a processor, a controller, a programmable logic device, and a field programmable gate array (FGPA).

The current stimulus circuit 520 has a first terminal, a second terminal, and a third terminal. The first terminal is electrically connected to the Vpp_Write line 515, the second terminal is electrically connected to the Vss line 517, and the third terminal is electrically connected to the control circuit 530. For example, when the current stimulus circuit 520 has an n-channel MOSFET, also referred to as a NMOS transistor, the drain terminal of the NMOS transistor is electrically connected to the Vpp_Write line 515, the source terminal of the NMOS transistor is electrically connected to the Vss line 517, and the gate terminal of the NMOS transistor is electrically connected to the control circuit 530. Further, in the above example, where the current stimulus circuit 520 has an NMOS transistor, the current stimulus circuit 520 can additionally have a fourth terminal corresponding to a body terminal of the NMOS transistor and the body terminal of the NMOS transistor can be electrically connected to the Vss line 517. Alternatively, the current stimulus circuit 520 can be omitted from the resistive change element device 500 when a PROGRAMMING operation of at least one resistive change element within at least one resistive change element cell in the resistive change element array 550 creates a desired change in current flow on the Vpp_Write line 515 and the Vss line 517. For example, a PROGRAMMING OPERATION of all resistive change elements within all cells on a word line at the same time, also referred to as page mode PROGRAMMING OPERATION, draws a large amount of current that can create a desired change in current flow on the Vpp_Write line 515 and the Vss line 517.

The address decoder and driver circuit 540 electrically connects at least one resistive change element cell in the resistive change element array 550 to the Vpp_Write line 515 and the Vss line 517 based on signals from the control circuit 530. The address decoder and driver circuit 540 is electrically connected to the Vpp line 513, the Vpp_Write line 515, the Vss line 517, a $V_{TE}$ line 543, a $V_{BE}$ line 545, and the control circuit 540. It is noted that the $V_{TE}$ line 543 can refer to a plurality of array lines in the resistive change element array 550 and the $V_{BE}$ 545 can refer to a plurality of array lines in the resistive change element array 550. It is further noted that when additional lines are used for selecting at least one resistive change element cell in the resistive change element array 550, such as when the resistive change element array 550 is a 1T1R resistive change element array, the address decoder and driver circuit 540 can be electrically connected to additional lines.

The address decoder and driver circuit 540 has a plurality of field effect transistors (FETs), such as Metal Oxide Silicon Field Effect Transistors (MOSFETs), carbon nanotube field effect transistors (CNTFETs), SiGE FETs, fully-depleted silicon-on-insulator FETs, and multiple gate field effect transistors such as FinFETs. The address decoder and driver circuit 540 can be designed such that the address decoder and driver circuit 540 clamps a maximum voltage on the Vpp_Write line 515. For example, when the address decoder and driver circuit 540 has a first PMOS transistor with a drain terminal electrically connected to the $V_{TE}$ line 543, a source terminal electrically connected to the Vpp_Write line 515, a gate terminal electrically connected to receive a signal to turn on and off the first PMOS transistor, and a body terminal electrically connected to the Vpp line 513, and a first NMOS transistor with a drain terminal electrically connected to the $V_{TE}$ line 543, a source terminal electrically connected to the Vpp_Write line 515, a gate terminal electrically connected to receive a signal to turn on and off the first NMOS transistor, and a body terminal electrically connected to Vpp line 513, a maximum voltage on the Vpp_Write line 515 is clamped to a voltage level approximately one diode drop greater than the voltage level of the Vpp line 513. It is noted that voltages clamped using body diodes differ from voltages clamped using ideal diodes because characteristics of body diodes differ from characteristics of ideal diodes.

Alternatively, the address decoder and driver circuit 540 can be designed such that the address decoder and driver circuit 540 does not clamp a maximum voltage on the Vpp_Write line 515. For example, when the address decoder and driver circuit 540 has a first PMOS transistor with a drain terminal electrically connected to the $V_{TE}$ line 543, a source terminal electrically connected to the Vpp_Write line 515, a gate terminal electrically connected to receive a signal to turn on and off the first PMOS transistor, and a body terminal electrically connected to the Vpp_Write line 515, and a first NMOS transistor with a drain terminal electrically connected to the $V_{TE}$ line 543, a source terminal electrically connected to the Vpp_Write line 515, a gate terminal electrically connected to receive a signal to turn on and off the first NMOS transistor, and a body terminal electrically connected to Vpp_Write line 513, the address decoder and driver circuit 540 does not clamp a maximum voltage on the Vpp_Write line 515.

A PROGRAMMING operation of a resistive change element is discussed below with respect to FIGS. 5B-5D. FIG. 5B illustrates a flow chart 560 showing a method for programming a resistive change element. The method starts in step 562 with generating a first voltage waveform in response to a current stimulus, where the first voltage waveform oscillates around a first voltage. The method continues in step 564 with transmitting at least part of the first voltage waveform and a second voltage to a resistive change element cell to apply an electrical stimulus to the resistive change element cell, where the second voltage has a substantially constant voltage level, and where the electrical stimulus has a voltage greater than a difference between the first voltage and the second voltage. The electrical stimulus can have one or more programming pulses of specific voltages, currents, pulse widths, and pulse shapes. The specific voltages, currents, pulse widths, and pulse shapes of the one or more programming pulses can be adjusted as required by the needs of a specific application. Alternatively, the electrical stimulus is a pulse train made up of a series of sub-pulses applied in immediate and rapid succession across a resistive change element. The specific voltage, current, duty cycle, frequency, and length of time of pulse trains can be adjusted as required by the needs of a specific application. Additionally, the specific voltages, currents, pulse widths, and pulse shapes, of the sub-pulses can be separately adjusted as required by the needs of a specific application.

A circuit designer can adjust electrical characteristics of the electrical stimulus by adjusting the electrical characteristics, such as amplitude, frequency, phase, and rate of attenuation, of the first voltage waveform and by adjusting the voltage level of the second voltage. For example, the electrical characteristics of the first voltage waveform can be adjusted by adjusting the size of the output inductance of the second output 514, adjusting the size of the output capacitance of the second output 514, electrically connecting at least one inductor to the Vpp_Write line 515, electrically connecting at least one capacitor to the Vpp_Write line 515, and adjusting a characteristic of at least one component of the current stimulus circuit 520 to adjust the rate of change of current flow on the Vpp_Write 515 and Vss line 517.

Additionally, the circuit designer can adjust electrical characteristics of the electrical stimulus by adjusting the signals supplied to the current stimulus circuit 520 and the address decoder and driver circuit 540. For example, the circuit designer can have the control circuit 530 supply a single pulse to the current stimulus circuit 520 to create a current stimulus having a single current spike or the circuit designer can have the control circuit 530 supply a square wave to the current stimulus circuit 520 to create a current stimulus having a plurality of current spikes. For example, the circuit designer can have the control circuit 530 supply a signal to the address decoder and driver circuit 540 to select the parts of the first voltage waveform transmitted to the resistive change element cell by controlling when the resistive change element cell is electrically connected to the Vpp_Write line 515 and the Vss line 517. It is noted that a current spike refers to a large amount of current flowing for a small amount of time. It is further noted that the first voltage and the second voltage are design variables that can be selected by the circuit designer.

Generating a first voltage waveform in response to a current stimulus, where the first voltage waveform oscillates around a first voltage, as similarly discussed above in step 562 of flow chart 560, is carried out by turning on the current stimulus circuit 520 for a set amount of time and then turning off the current stimulus circuit 520. The current stimulus circuit 520 creates a current path from the Vpp_Write line 515 to the Vss line 517 through the current stimulus circuit 520 for the set amount of time the current stimulus circuit 520 is turned on. The current stimulus circuit 520 to removes the current path from the Vpp_Write line 515 to the Vss line 517 through the current stimulus circuit 520 when the current stimulus circuit 520 is turned off after the set amount of time. It is noted that the set amount of time the current stimulus circuit 520 is turned on is a design variable that can be adjusted by a circuit designer and the number of times the current stimulus circuit 520 is turned on and turn off is a design variable that can be adjusted by a circuit designer.

The current stimulus circuit 520 is turned on and turned off by a signal supplied by the control circuit 530. When the current stimulus circuit 520 is turned on the current stimulus circuit 520 to creates a current path from the Vpp_Write line 515 to the Vss line 517 through the current stimulus circuit 520. The current path current path from the Vpp_Write line 515 to the Vss line 517 through the current stimulus circuit 520 causes an amount of current flowing on the Vpp_Write line 515 to increase and an amount of current flowing on the Vss line 517 to increase. FIG. 5C shows a current Iss flowing from the Vpp_Write line 515 to the Vss line 517 through the current stimulus circuit 520. A rate of change of the amount of current flowing on the Vpp_Write line 515 is positive because the amount of current flowing on the Vpp_Write line 515 is increasing and a rate of change of the amount of current flowing on the Vss line 517 is positive because the amount of current flowing on the Vss line 517 is increasing. The output inductance associated with the second output 514 of the power supply 510 resists the increasing amount of current flowing on the Vpp_Write line 515 and the output inductance associated with the second output 514 causes the voltage on the Vpp_Write line 515 to drop in response to the increasing amount of current flowing on the Vpp_Write line 515. For example, when a steady state voltage on the Vpp_Write line 515 is 2.5 volts, an increasing amount of current flowing on the Vpp_Write line 515 can cause the voltage on the Vpp_Write line 515 to decrease below 2.5 volts. The output inductance associated with the third output 516 of the power supply 510 resists the increasing amount of current flowing on the Vss line 517 and the output inductance associated with the third output 516 can cause the voltage on the Vss line 517 to increase in response to the increasing amount of current flowing on the Vss line. However, the output inductance and the output capacitance associated with the third output 516 are not sized for generating a voltage waveform so the voltage on the Vss line 517 remains substantially constant at the second system voltage Vss.

When the current stimulus circuit 520 is turned off after the set amount of time the current path from the Vpp_Write line 515 to the Vss line 517 through the current stimulus circuit 520 is removed. Removing the current path current path from the Vpp_Write line 515 to the Vss line 517 through the current stimulus circuit 520 causes the amount of current flowing on the Vpp_Write line 515 to decrease and an amount of current flowing on the Vss line 517 to decrease. A rate of change of the amount of current flowing on the Vpp_Write line 517 is negative because the amount of current flowing on the Vpp_Write line 515 is decreasing and a rate of change of the amount of current flowing on the Vss line 517 is negative because the amount of current flowing on the Vss line 517 is decreasing. The output inductance associated with the second output 514 of the power supply 510 resists the decreasing amount of current flowing on the Vpp_Write line 515 and the output inductance associated with the second output 514 causes the voltage on the Vpp_Write line 515 to increase in response to the decreasing amount of current flowing on the Vpp_Write line 515. For example, when a steady state voltage on the Vpp_Write line 515 is 2.5 volts, a decreasing amount of current flowing on the Vpp_Write 515 line can cause the voltage on the Vpp_Write line 515 to increase above 2.5 volts. The output inductance associated with the third output 516 of the power supply 510 resists the decreasing amount of current flowing on the Vss line 517 and the output inductance associated with the third output 516 can causes the voltage on the Vss line 517 to decrease in response to the decreasing amount of current flowing on the Vss line 517. However, the output inductance and the output capacitance associated with the third output 516 are not sized for generating a voltage waveform so the voltage on the Vss line 517 remains substantially constant at the second system voltage Vss. The increased voltage on the Vpp_Write line 515 and the substantially constant voltage on the Vss line 517 form a voltage waveform across the Vpp_Write line 515 and the Vss line 517 having a part with a voltage greater than a steady state voltage level that can be supplied by the power supply 510. It is noted that the in response to a current stimulus having a single current spike the voltage on the Vpp_Write line 515 will oscillate around the first system voltage Vpp with amplitude of the voltage waveform attenuating over time. It is also noted that in response to a current stimulus have a plurality of current spike, the voltage on the Vpp_Write line 515 will oscillate around the first system voltage Vpp with amplitude of the voltage waveform returning to approximately the maximum amplitude after each current spike.

Transmitting at least part of the first voltage waveform and a second voltage to a resistive change element cell to apply an electrical stimulus to the resistive change element cell, where the second voltage has a substantially constant voltage level, and where the electrical stimulus has a voltage greater than a difference between the first voltage and the second voltage, as similarly discussed above in step 564 of flow chart 560, is carried out by the address decoder and driver circuit 540 electrically connecting a resistive change element cell in the resistive change element array 550 to the Vpp_Write line 515 and the Vss line 517 to apply a part of the voltage waveform formed across the Vpp_Write line 515 and the Vss line 517 to the resistive change element cell. The address decoder and driver circuit 540 electrically connects a resistive change element cell in the resistive change element array 550 to the Vpp_Write line 517 and the Vss line 517 based on signals supplied by the control circuit 530. FIG. 5D shows the electrical stimulus being applied to the resistive change element cell in the resistive change element array 550. It is noted that the timing of the signals supplied by the control circuit 530 to address decoder and driver circuit 540 and the current stimulus circuit 520 are arranged such that the electrical stimulus applied to the resistive change element cell has a voltage level greater than the steady state voltage level across the Vpp_Write line 515 and the Vss line 517.

Figure 5E:
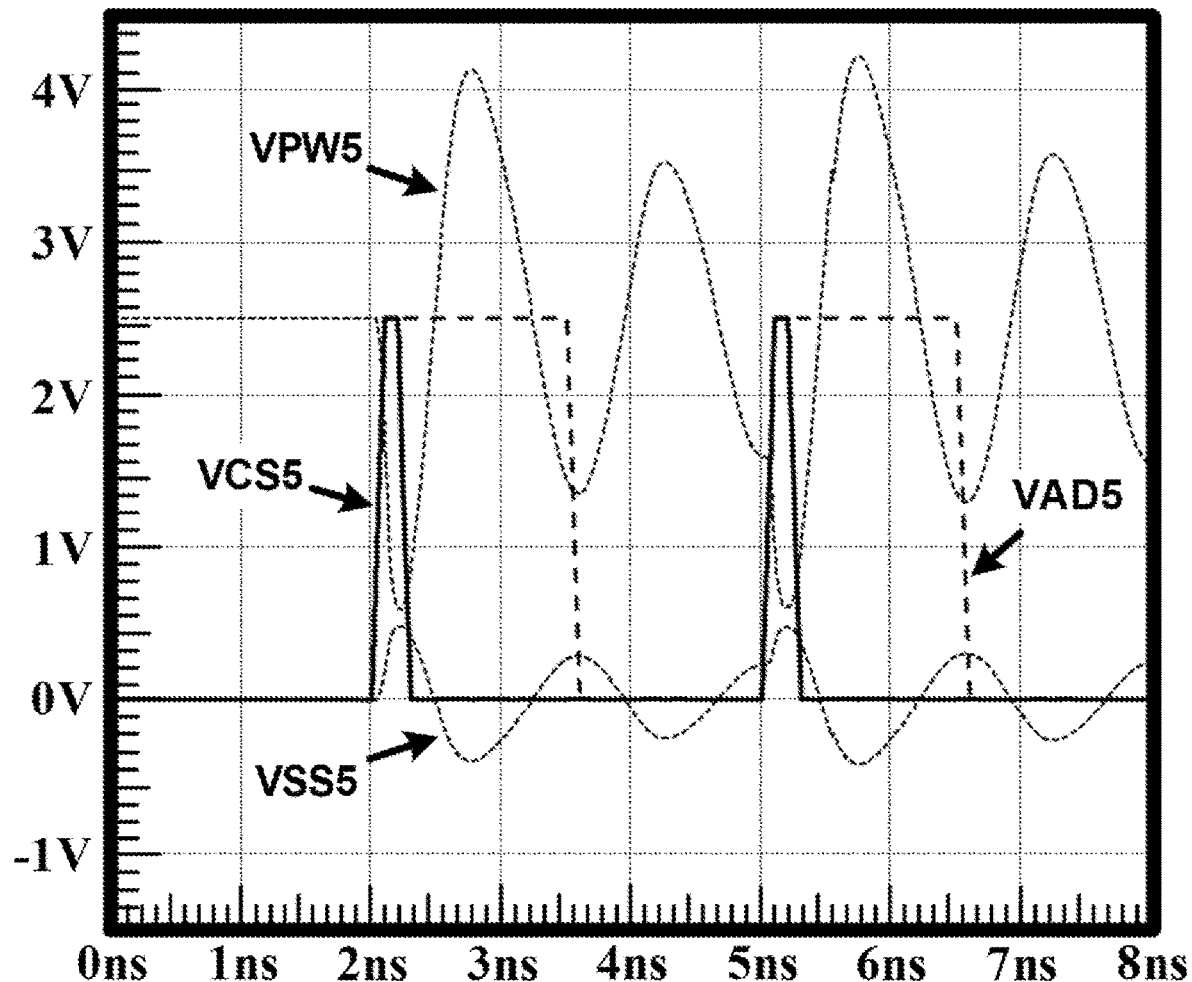
FIG. 5E illustrates voltage waveforms for during a simulated PROGRAMMING operation of a resistive change element cell in resistive change element array of FIG. 5A.
Figure 5F:
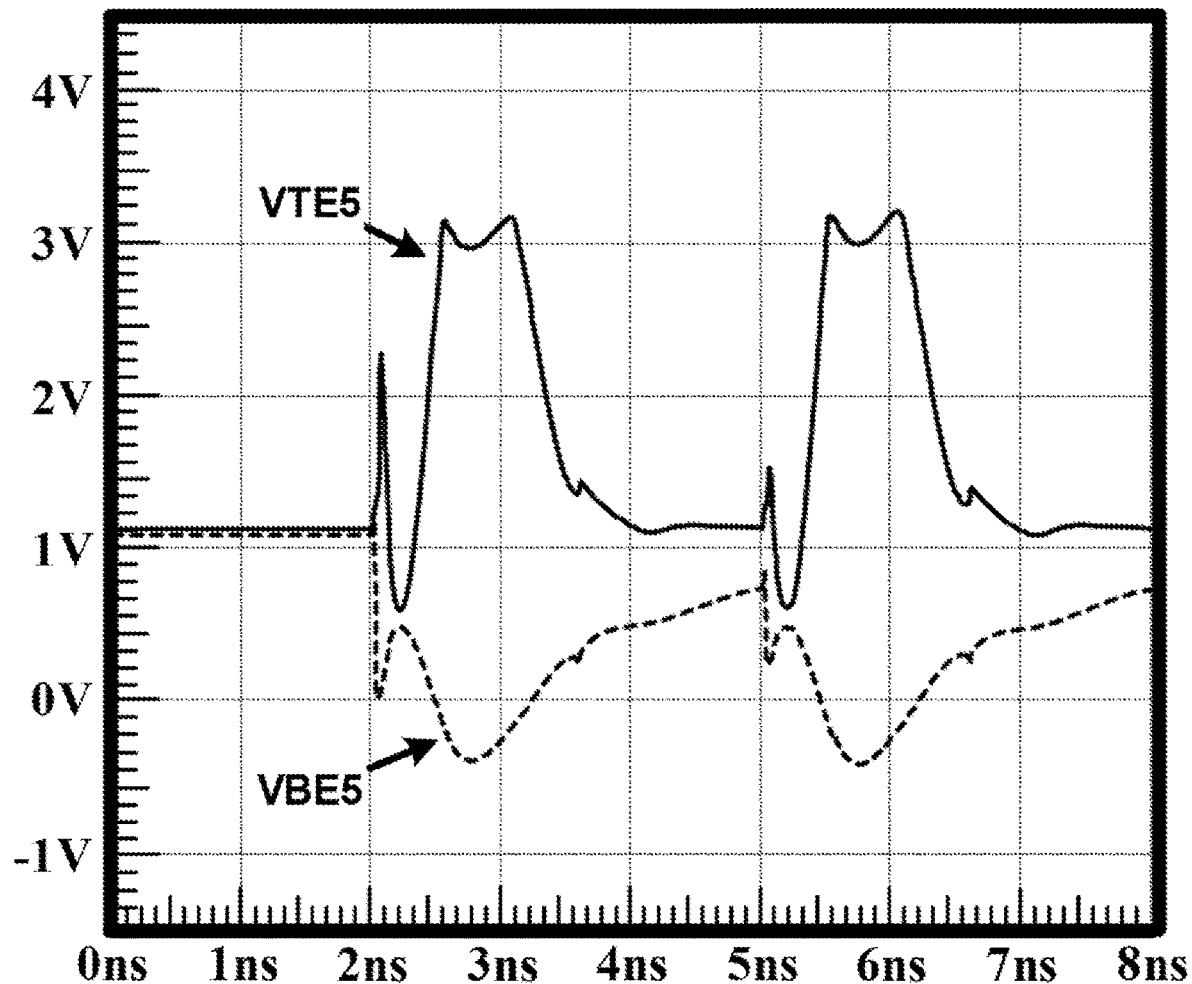
FIG. 5F illustrates voltage waveforms for forming an electrical stimulus during a simulated PROGRAMMING operation of a resistive change element cell in resistive change element array of FIG. 5A.
Figure 5G:
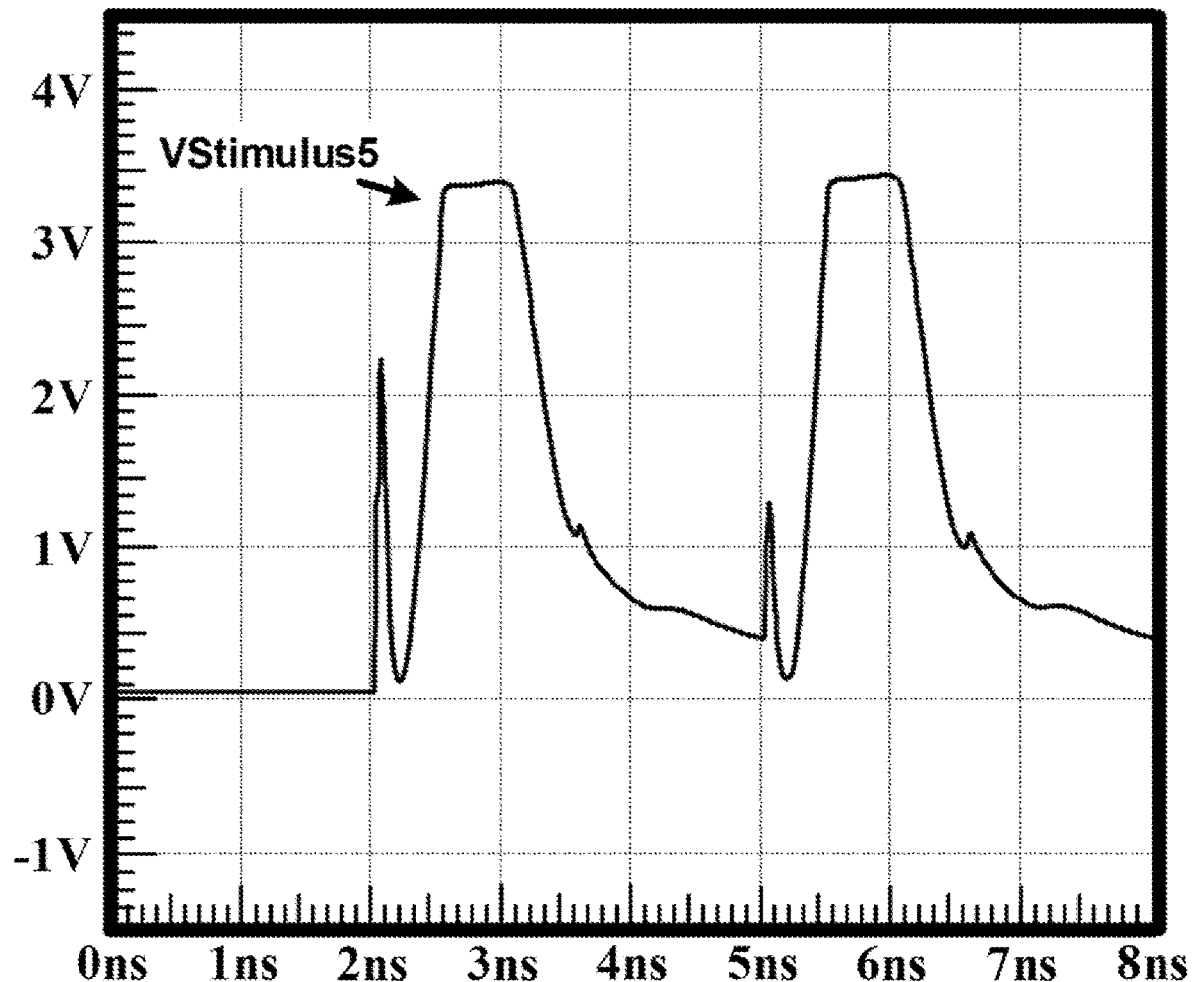
FIG. 5G illustrates a voltage waveform for an electrical stimulus during a simulated PROGRAMMING operation of a resistive change element cell in resistive change element array of FIG. 5A.

FIG. 5E illustrates a signal VCS5 supplied to the current stimulus circuit 520 by the control circuit 530, a signal VAD5 supplied to the address decoder and driver circuit 540 by the control circuit 530, a voltage waveform VPW5 on the Vpp_Write line 515 and a voltage waveform VSS5 on the Vss line 517 during a simulated PROGRAMMING operation of a resistive change element in the resistive change element array of FIG. 5A. FIG. 5F illustrates a voltage waveform VTE5 and a voltage waveform VBE5 transmitted by the address decoder and driver circuit 540 based on the signal VAD5 supplied to the address decoder and driver circuit 540 by the control circuit 530. FIG. 5G illustrates an electrical stimulus Vstimulus5 applied to a resistive change element cell. It is noted that first system voltage Vpp is 2.5 volts and the second system voltage Vss is 0 volts for the simulated PROGRAMMING operation. It is also noted that the voltage waveform VPW5 on the Vpp_Write line 515 has a maximum voltage level clamped to a voltage level approximately one diode drop greater than the voltage level of the Vpp line 513 because the address decoder and driver circuit 540 for the simulated PROGRAMMING operation clamps a maximum voltage on the Vpp_Write line 515 to a voltage level approximately one diode drop greater than the voltage level of the Vpp line 513. It is further noted that the address decoder and driver circuit 540 can receive additional signals, such as address signals, from the control circuit 530, however, additional signals are not discussed for describing the simulated PROGRAMMING operation.

The signal VCS5 supplied to the current stimulus circuit 520, as shown in FIG. 5E, is a square wave having an amplitude of approximately 2.5 volts, a period of approximately 0.3 nanoseconds (ns), a frequency of approximately 333.3 MHz, and a duty cycle of approximately 8.3%. The signal VCS5 supplied to the current stimulus circuit 520 by the control circuit 530 turns on the current stimulus circuit 520 at approximately 2 ns, turns off the current stimulus circuit 520 at approximately 2.3 ns, turns on the current stimulus circuit 520 at approximately 5 ns, and turns off the current stimulus circuit 520 at approximately 5.3 ns. When the current stimulus circuit 520 is turned on the current stimulus circuit 520 creates a current path from the Vpp_Write line 515 to the Vss line 517 through the current stimulus circuit 520 and when the current stimulus circuit is turned off the current stimulus circuit 520 removes the current path from the Vpp_Write line 515 to the Vss line 517. Turning on and off the current stimulus circuit 520 twice creates a current stimulus having two current spikes. The voltage on the Vpp_Write line 515 changes from the steady state voltage of 2.5 volts and begins ringing or oscillating around the steady state voltage of 2.5 volts at approximately 2 ns in response to the current stimulus as shown in FIG. 5E. The voltage ringing or oscillating around the steady state voltage of 2.5 volts on the Vpp_Write line 515 attenuates over time after the first current spike, returns to approximately a maximum amplitude after the second current spike, and attenuates over time after the second current spike. The voltage on the Vss_Write line 517 remains substantially constant at 0 volts.

The signal VAD5 supplied to the address decoder and driver circuit 540, as shown in FIG. 5E, is a square wave having an amplitude of approximately 2.5 volts, a period of approximately 3 nanoseconds (ns), a frequency of approximately 333.3 MHz, and a duty cycle of approximately 50%. The address decoder and driver circuit 540 transmits the voltage waveform on the Vpp_Write line 515 and the voltage waveform on the Vss line 517 from approximately 2 ns to approximately 3.6 ns and from approximately 5 ns to approximately 6.6 ns to a resistive change element cell in the resistive change element array 550 based on the signal VAD5 supplied by the control circuit 530. The address decoder and driver circuit 540 electrically connects the resistive change element cell to the Vpp_Write line 515 and the Vss line 517 at approximately 2 ns, electrically disconnects the resistive change element cell from the Vpp_Write line 515 and the Vss line 517 at approximately 3.6 ns, electrically connects the resistive change element cell to the Vpp_Write line 515 and the Vss line 517 at approximately 5 ns, and electrically disconnects the resistive change element cell from the Vpp_Write line 515 and the Vss line 517 at approximately 6.6 ns. FIG. 5F shows the voltage waveform VTE5 transmitted by the address decoder and driver circuit 540 from approximately 2 ns to approximately 3.6 ns and from approximately 5 ns to approximately 6.6 ns and the voltage waveform VBE5 transmitted by the address decoder and driver circuit 440 from approximately 2 ns to approximately 3.6 ns and from approximately 5 ns to approximately 6.6 ns. It is noted that shape of the voltage waveform VTE5 differs from the voltage waveform VPW5 on the Vpp_Write line 515 because the impedance of the Vpp_Write line 515 differs from the $V_{TE}$ line 543. It is also noted that shape of the voltage waveform VBE5 differs from the voltage waveform VSS5 on the Vss line 517 because the impedance of the Vss line 517 differs from the $V_{BE}$ line 545.

The electrical stimulus Vstimulus5, as shown in FIG. 5G has a first voltage pulse having a voltage of approximately 3.4 volts and a second voltage pulse having a voltage of approximately 3.4 volts. The first voltage pulse of the electrical stimulus is formed by the voltage waveform VPW5 on the Vpp_Write line 515 transmitted by the address decoder and driver circuit 540 from approximately 2 ns to approximately 3.6 ns and the voltage waveform VSS5 on the Vss line 517 transmitted by the address decoder and driver circuit 540 from approximately 2 ns to approximately 3.6 ns. The second voltage pulse of the electrical stimulus is formed by the voltage waveform VPW5 on the Vpp_Write line 515 transmitted by the address decoder and driver 540 from approximately 5 ns to approximately 6.6 ns and the voltage waveform VSS5 on the Vss line 517 transmitted by the address decoder and driver circuit 540 from approximately 5 ns to approximately 6.6 ns.

Figure 6A:
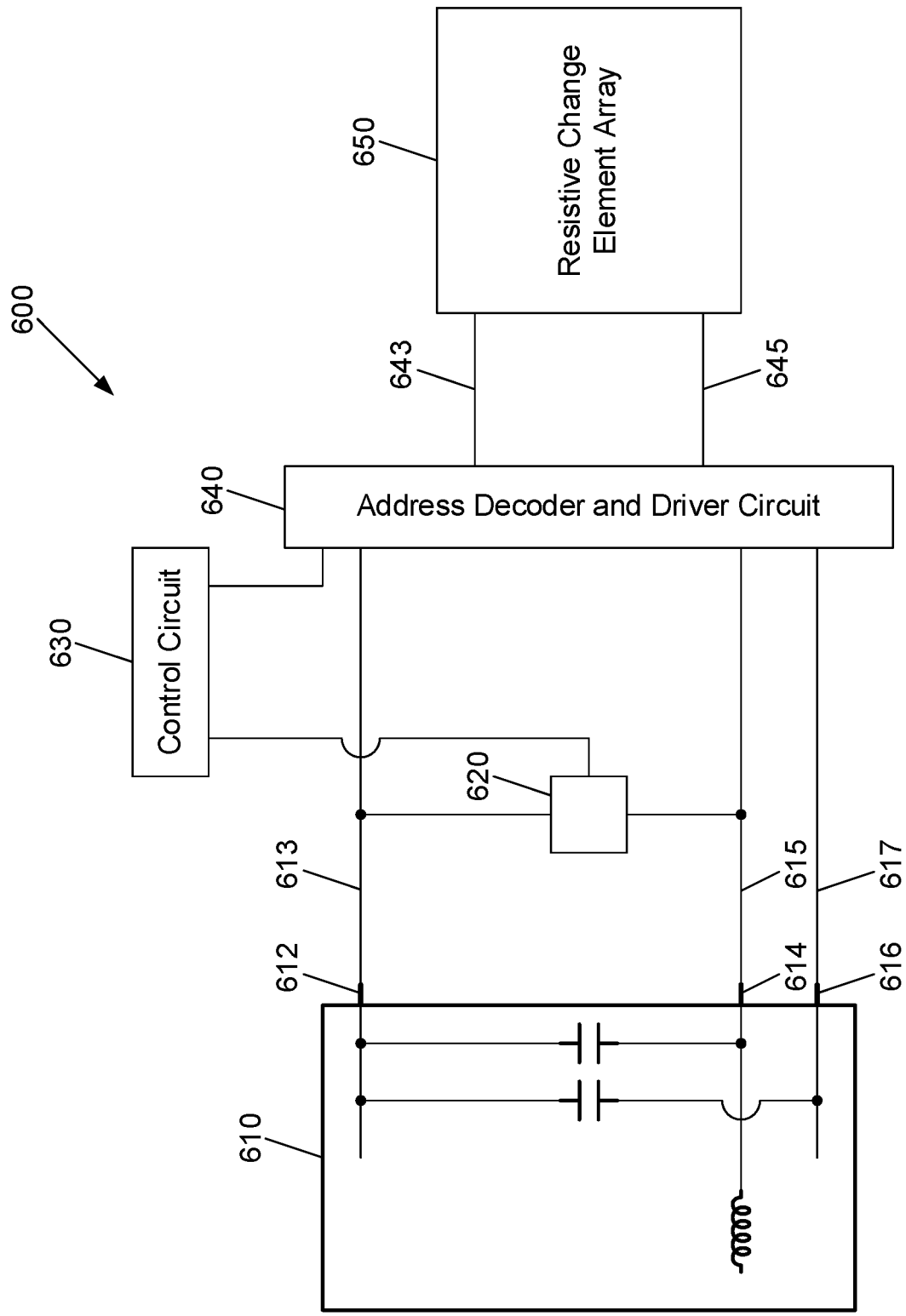
FIG. 6A illustrates a simplified schematic diagram of a resistive change element array having a power supply with a second output configured for generating a voltage waveform electrically connected to a Vss_Write line.

Referring now to FIG. 6A, a simplified schematic diagram of a resistive change element device 600 having a power supply 610, a current stimulus circuit 620, a control circuit 630, an address decoder and driver circuit 640, and a resistive change element array 650 is illustrated. The resistive change element device 600 can program at least one resistive change element within at least one resistive change element cell in resistive change element array 650 using an electrical stimulus having a voltage level greater than a steady state voltage level that can be supplied by the power supply 610. The resistive change element array 650 can be a 1T1R resistive change element array as discussed above with respect to FIG. 1, a 1D1R resistive change element array as discussed above with respect to FIG. 2, and a 1-R resistive change element array as discussed above with respect to FIG. 3.

The power supply 610 has a first output 612, a second output 614, and a third output 616. The power supply 610 can supply a first system voltage Vpp on the first output 612, a second system voltage Vss on the second output 614, and the second system voltage Vss on the third output 616. The first output 612 is electrically connected to a Vpp line 613, the second output 614 is electrically connected to a Vss_Write line 615, and the third output 616 is electrically connected to a Vss line 617. It is noted that although the first system voltage Vpp is discussed below as having a voltage level of 2.5 volts, the first system voltage Vpp is not limited to having a voltage level of 2.5 volts and that a circuit designer can select other voltage levels for the first system voltage Vpp, such as a voltage level greater than 2.5 volts and a voltage level less than 2.5 volts. It is also noted that although the second system voltage Vss is discussed below as having a voltage level of 0 volts or ground, the second system voltage Vss is not limited to having a voltage level of 0 volts or ground and that a circuit designer can select other voltage levels for the second system voltage Vss, such as a voltage level greater than 0 volts and a voltage level less than 0 volts.

Figure 6B:
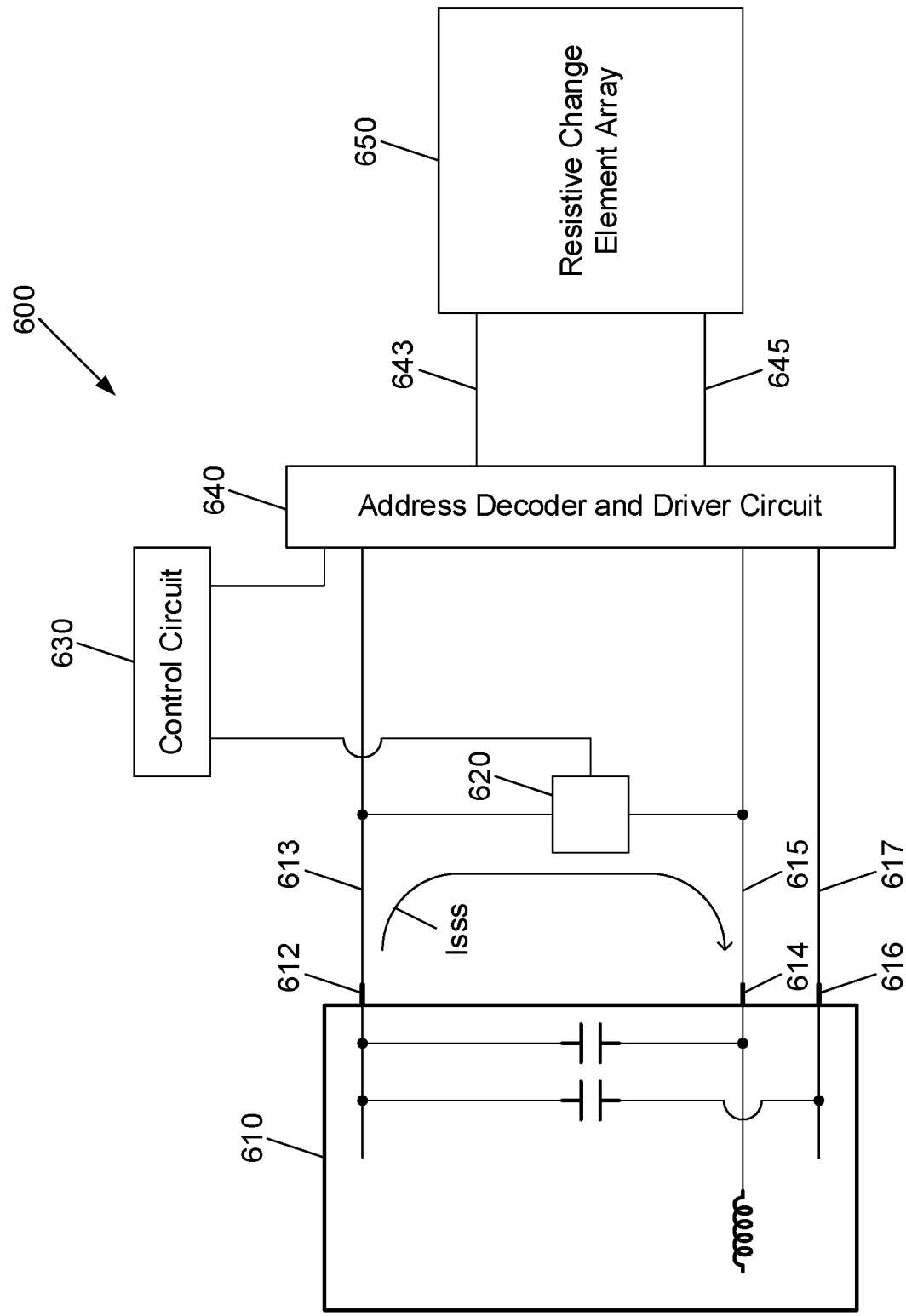
FIG. 6B illustrates a simplified schematic diagram showing current flow through the current stimulus circuit in the resistive change element array of FIG. 6A.
Figure 6C:
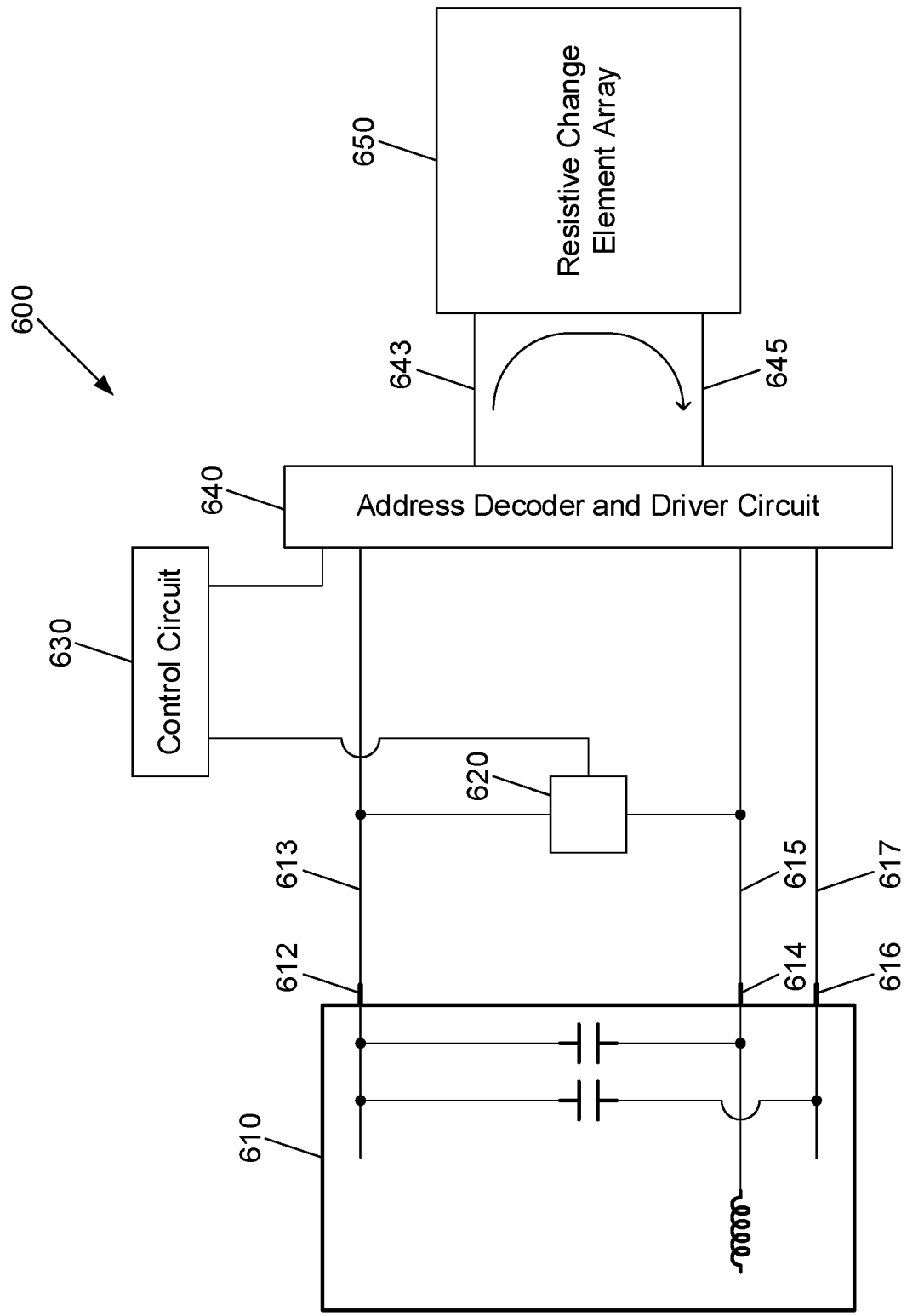
FIG. 6C illustrates a simplified schematic diagram showing current flow through a resistive change element cell in the resistive change element array of FIG. 6A.

Each of the first output 612, the second output 614, and the third output 616 have an output inductance and an output capacitance. FIGS. 6A-6C visually illustrate an output capacitance associated with the first output 612 and the third output 616 and an output inductance and an output capacitance associated with the second output 614. The output capacitance associated with the first output 612 and the third output 616 and the output inductance and the output capacitance associated with the second output 614 are not separate components but rather are inductances and capacitances associated with other components, packaging, and/or electrical connections. For example, the output inductances and the output capacitances can be formed by the internal circuitry of the power supply 610, the packaging of the power supply 610, and/or the external connections of the power supply 610. The output inductances and the output capacitances are shown in FIGS. 6A-6C for the purpose of explaining programming at least one resistive change element within at least one resistive change element cell in the resistive change element array 650 using an electric stimulus having a voltage level greater than a steady state voltage level that can be supplied by the power supply 610.

The output inductances and the output capacitances associated with the first output 612, the second output 614, and the third output 616 are design variables selected by a circuit designer. The output inductance and the output capacitance associated with the second output 614 are design variables selected by a circuit designer for a generating voltage waveform in response to a change in current flow on the Vss_Write line 615. The voltage waveform produced from the second output 614 rings or oscillates around the second system voltage Vss. The voltage produced from the first output 612 is substantially constant at the first system voltage Vpp. It is noted that the voltage produced from the first output 612 can have small amount of noise and/or ringing or oscillating around the first system voltage Vpp and still be considered substantially constant at the first system voltage Vpp. For example, when the first system voltage Vpp is 2.5 volts and the second system voltage Vss is 0 volts or ground, the output inductance and the output capacitance associated with the second output 614 are selected such that a voltage waveform produced from the second output 614 rings or oscillates around 0 volts, the voltage produced from the first output 612 is substantially constant at 2.5 volts, and a voltage waveform across the Vpp line 613 and the Vss_Write line 615 has a least one part with a voltage level greater than 2.5 volts.

The current stimulus circuit 620 creates a current path from the Vpp line 613 to the Vss_Write line 615 based on a signal from the control circuit 630. The current stimulus circuit 620 has a switch such as a field effect transistor (FET), such as Metal Oxide Silicon Field Effect Transistor (MOSFET), carbon nanotube field effect transistor (CNT-FET), SiGE FETs, fully-depleted silicon-on-insulator FET, and a multiple gate field effect transistor such as FinFET. The amount of current flowing from the Vpp line 613 to the Vss_Write line 615 through the current stimulus circuit 620 can be regulated by the signal supplied by the control circuit 630 and/or the current carrying capacity of the switch in the current stimulus circuit 620. Additionally, the current stimulus circuit 620 can have at least one other component for regulating current flow, such as a resistor and a current source, electrically connected to the switch to regulate current flow from the Vpp line 613 to the Vss_Write line 615. The control circuit 630 can be a processor, a controller, a programmable logic device, and a field programmable gate array (FGPA).

The current stimulus circuit 620 has a first terminal, a second terminal, and a third terminal. The first terminal is electrically connected to the Vpp line 613, the second terminal is electrically connected to the Vss_Write line 615, and the third terminal is electrically connected to the control circuit 630. For example, when the current stimulus circuit 620 has an n-channel MOSFET, also referred to as a NMOS transistor, the drain terminal of the NMOS transistor is electrically connected to the Vpp line 615, the source terminal of the NMOS transistor is electrically connected to the Vss_Write line 615, and the gate terminal of the NMOS transistor is electrically connected to the control circuit 630. Further, in the above example, where the current stimulus circuit 620 has an NMOS transistor, the current stimulus circuit 620 can additionally have a fourth terminal corresponding to a body terminal of the NMOS transistor and the body terminal of the NMOS transistor can be electrically connected to the Vss line 617. Alternatively, the current stimulus circuit 620 can be omitted from the resistive change element device 600 when a PROGRAMMING operation of at least one resistive change element within at least one resistive change element cell in the resistive change element array 650 creates a desired change in current flow on the Vpp line 613 and the Vss_Write line 615. For example, a PROGRAMMING OPERATION of all resistive change elements within all cells on a word line at the same time, also referred to as page mode PROGRAMMING OPERATION, draws a large amount of current that can create a desired change in current flow on the Vpp line 613 and the Vss_Write line 615.

The address decoder and driver circuit 640 electrically connects at least one resistive change element cell in the resistive change element array 650 to the Vpp line 615 and the Vss_Write line 615 based on signals from the control circuit 630. The address decoder and driver circuit 640 is electrically connected to the Vpp line 613, the Vss_Write line 615, the Vss line 617, a $V_{TE}$ line 643, a $V_{BE}$ line 645, and the control circuit 640. It is noted that the $V_{TE}$ line 643 can refer to a plurality of array lines in the resistive change element array 650 and the $V_{BE}$ 645 can refer to a plurality of array lines in the resistive change element array 650. It is further noted that when additional lines are used for selecting at least one resistive change element cell in the resistive change element array 650, such as when the resistive change element array 650 is a 1T1R resistive change element array, the address decoder and driver circuit 640 can be electrically connected to additional lines.

The address decoder and driver circuit 640 has a plurality of field effect transistors (FETs), such as Metal Oxide Silicon Field Effect Transistors (MOSFETs), carbon nanotube field effect transistors (CNTFETs), SiGE FETs, fully-depleted silicon-on-insulator FETs, and multiple gate field effect transistors such as FinFETs. The address decoder and driver circuit 640 can be designed such that the address decoder and driver circuit 640 clamps a minimum voltage on the Vss_Write line 615. For example, when the address decoder and driver circuit 640 has a first PMOS transistor with a drain terminal electrically connected to the $V_{BE}$ line 645, a source terminal electrically connected to the Vss_Write line 615, a gate terminal electrically connected to receive a signal to turn on and off the first PMOS transistor, and a body terminal electrically connected to the Vss line 617, and a first NMOS transistor with a drain terminal electrically connected to the $V_{BE}$ line 645, a source terminal electrically connected to the Vss_Write line 615, a gate terminal electrically connected to receive a signal to turn on and off the first NMOS transistor, and a body terminal electrically connected to Vss line 617, a minimum voltage on the Vss_Write line 615 is clamped to a voltage level approximately one diode drop less than the voltage level of the Vss line 617. It is noted that voltages clamped using body diodes differ from voltages clamped using ideal diodes because characteristics of body diodes differ from characteristics of ideal diodes.

Alternatively, the address decoder and driver circuit 640 can be designed such that the address decoder and driver circuit 640 does not clamp a minimum voltage on the Vss_Write line 615. For example, when the address decoder and driver circuit 640 has a first PMOS transistor with a drain terminal electrically connected to the $V_{BE}$ line 645, a source terminal electrically connected to the Vss_Write line 615, a gate terminal electrically connected to receive a signal to turn on and off the first PMOS transistor, and a body terminal electrically connected to the Vss_Write line 615, and a first NMOS transistor with a drain terminal electrically connected to the $V_{BE}$ line 645, a source terminal electrically connected to the Vss_Write line 615, a gate terminal electrically connected to receive a signal to turn on and off the first NMOS transistor, and a body terminal electrically connected to the Vss_Write line 615, the address decoder and driver circuit 540 does not clamp a minimum voltage on the Vss_Write line 615.

A PROGRAMMING operation of a resistive change element is discussed below with respect to FIGS. 5B and 6B-6C. FIG. 5B illustrates a flow chart 560 showing a method for programming a resistive change element. The method starts in step 562 with generating a first voltage waveform in response to a current stimulus, where the first voltage waveform oscillates around a first voltage. The method continues in step 564 with transmitting at least part of the first voltage waveform and a second voltage to a resistive change element cell to apply an electrical stimulus to the resistive change element cell, where the second voltage has a substantially constant voltage level, and where the electrical stimulus has a voltage greater than a difference between the first voltage and the second voltage. The electrical stimulus can have one or more programming pulses of specific voltages, currents, pulse widths, and pulse shapes. The specific voltages, currents, pulse widths, and pulse shapes of the one or more programming pulses can be adjusted as required by the needs of a specific application. Alternatively, the electrical stimulus is a pulse train made up of a series of sub-pulses applied in immediate and rapid succession across a resistive change element. The specific voltage, current, duty cycle, frequency, and length of time of pulse trains can be adjusted as required by the needs of a specific application. Additionally, the specific voltages, currents, pulse widths, and pulse shapes, of the sub-pulses can be separately adjusted as required by the needs of a specific application.

A circuit designer can adjust electrical characteristics of the electrical stimulus by adjusting the electrical characteristics, such as amplitude, frequency, phase, and rate of attenuation, of the first voltage waveform and by adjusting the voltage level of the second voltage. For example, the electrical characteristics of the first voltage waveform can be adjusted by adjusting the size of the output inductance of the second output 614, adjusting the size of the output capacitance of the second output 614, electrically connecting at least one inductor to the Vss_Write line 615, electrically connecting at least one capacitor to the Vss_Write line 615, and adjusting a characteristic of at least one component of the current stimulus circuit 620 to adjust the rate of change of current flow on the Vpp line 613 and Vss_Write line 615.

Additionally, the circuit designer can adjust electrical characteristics of the electrical stimulus by adjusting the signals supplied to the current stimulus circuit 620 and the address decoder and driver circuit 640. For example, the circuit designer can have the control circuit 630 supply a single pulse to the current stimulus circuit 620 to create a current stimulus having a single current spike or the circuit designer can have the control circuit 630 supply a square wave to the current stimulus circuit 620 to create a current stimulus having a plurality of current spikes. For example, the circuit designer can have the control circuit 630 supply a signal to the address decoder and driver circuit 640 to select the parts of the first voltage waveform transmitted to the resistive change element cell by controlling when the resistive change element cell is electrically connected to the Vpp line 613 and the Vss_Write line 615. It is noted that a current spike refers to a large amount of current flowing for a small amount of time. It is further noted that the first voltage and the second voltage are design variables that can be selected by the circuit designer.

Generating a first voltage waveform in response to a current stimulus, where the first voltage waveform oscillates around a first voltage, as similarly discussed above in step 562 of flow chart 560, is carried out by turning on the current stimulus circuit 620 for a set amount of time and then turning off the current stimulus circuit 620. The current stimulus circuit 620 creates a current path from the Vpp line 613 to the Vss_Write line 615 through the current stimulus circuit 620 for the set amount of time the current stimulus circuit 620 is turned on. The current stimulus circuit 620 to removes the current path from the Vpp line 613 to the Vss_Write line 615 through the current stimulus circuit 620 when the current stimulus circuit 620 is turned off after the set amount of time. It is noted that the set amount of time the current stimulus circuit 620 is turned on is a design variable that can be adjusted by a circuit designer and the number of times the current stimulus circuit 620 is turned on and turn off is a design variable that can be adjusted by a circuit designer.

The current stimulus circuit 620 is turned on and turned off by a signal supplied by the control circuit 630. When the current stimulus circuit 620 is turned on the current stimulus circuit 620 to creates a current path from the Vpp line 613 to the Vss_Write line 615 through the current stimulus circuit 620. The current path current path from the Vpp line 613 to the Vss_Write line 615 through the current stimulus circuit 620 causes an amount of current flowing on the Vpp line 613 to increase and an amount of current flowing on the Vss_Write line 615 to increase. FIG. 6B shows a current Isss flowing from the Vpp line 613 to the Vss_Write line 615 through the current stimulus circuit 620. A rate of change of the amount of current flowing on the Vpp line 613 is positive because the amount of current flowing on the Vpp line 613 is increasing and a rate of change of the amount of current flowing on the Vss_Write line 615 is positive because the amount of current flowing on the Vss_Write line 615 is increasing. The output inductance associated with the first output 612 of the power supply 610 resists the increasing amount of current flowing on the Vpp line 613 and the output inductance associated with the first output 612 can cause the voltage on the Vpp line 613 to drop in response to the increasing amount of current flowing on the Vpp line 613. However, the output inductance and the output capacitance associated with the first output 612 are not sized for generating a voltage waveform so the voltage on the Vpp line 613 remains substantially constant at the first system voltage Vpp. The output inductance associated with the second output 614 of the power supply 610 resists the increasing amount of current flowing on the Vss_Write line 615 and the output inductance associated with the second output 614 causes the voltage on the Vss_Write line 615 to increase in response to the increasing amount of current flowing on the Vss_Write line 615. For example, when the steady state voltage on the Vss_Write line 615 is 0 voltage or ground, an increasing amount of current flowing on the Vss_Write line 615 can cause the voltage on the Vss_Write line 615 to increase above 0 volts or ground.

When the current stimulus circuit 620 is turned off after the set amount of time the current path from the Vpp line 613 to the Vss_Write line 615 through the current stimulus circuit 620 is removed. Removing the current path current path from the Vpp line 613 to the Vss_Write line 615 through the current stimulus circuit 620 causes the amount of current flowing on the Vpp line 615 to decrease and an amount of current flowing on the Vss_Write line 615 to decrease. A rate of change of the amount of current flowing on the Vpp line 613 is negative because the amount of current flowing on the Vpp line 612 is decreasing and a rate of change of the amount of current flowing on the Vss_Write line 615 is negative because the amount of current flowing on the Vss_Write line 615 is decreasing. The output inductance associated with the first output 612 of the power supply 610 resists the decreasing amount of current flowing on the Vpp line 613 and the output inductance associated with the first output 612 can causes the voltage on the Vpp line 613 to increase in response to the decreasing amount of current flowing on the Vpp line 613. However, the output inductance and the output capacitance associated with the first output 612 are not sized for generating a voltage waveform so the voltage on the Vpp line 613 remains substantially constant at the first system voltage Vpp. The output inductance associated with the second output 614 of the power supply 610 resists the decreasing amount of current flowing on the Vss_Write line 615 and the output inductance associated with the second output 614 causes the voltage on the Vss_Write line 615 to decrease in response to the decreasing amount of current flowing on the Vss_Write line 615. For example, when the steady state voltage on the Vss_Write line 615 is 0 voltage or ground, a decreasing amount of current flowing on the Vss_Write line 615 can cause the voltage on the Vss_Write line 615 to decrease below 0 volts or ground. The substantially constant voltage on the Vpp line 613 and the decreased voltage on the Vss_Write line 615 form a voltage waveform across the Vpp line 613 and the Vss_Write line 615 having a part with a voltage greater than a steady state voltage level that can be supplied by the power supply 610. It is noted that the in response to a current stimulus having a single current spike the voltage on the Vss_Write line 615 will oscillate around the second system voltage Vss with amplitude of the voltage waveform attenuating over time. It is also noted that in response to a current stimulus have a plurality of current spike, the voltage on the Vss_Write line 615 will oscillate around the second system voltage Vss with amplitude of the voltage waveform returning to approximately the maximum amplitude after each current spike.

Transmitting at least part of the first voltage waveform and a second voltage to a resistive change element cell to apply an electrical stimulus to the resistive change element cell, where the second voltage has a substantially constant voltage level, and where the electrical stimulus has a voltage greater than a difference between the first voltage and the second voltage, as similarly discussed above in step 564 of flow chart 560, is carried out by the address decoder and driver circuit 640 electrically connecting a resistive change element cell in the resistive change element array 650 to the Vpp line 613 and the Vss_Write line 615 to apply a part of the voltage waveform formed across the Vpp line 613 and the Vss_Write line 615 to the resistive change element cell. The address decoder and driver circuit 640 electrically connects a resistive change element cell in the resistive change element array 650 to the Vpp line 613 and the Vss_Write line 615 based on signals supplied by the control circuit 630. FIG. 6C shows the electrical stimulus being applied to the resistive change element cell in the resistive change element array 650. It is noted that the timing of the signals supplied by the control circuit 630 to address decoder and driver circuit 640 and the current stimulus circuit 620 are arranged such that the electrical stimulus applied to the resistive change element cell has a voltage level greater than the steady state voltage level across the Vpp line 613 and the Vss_Write line 615.

Figure 6D:
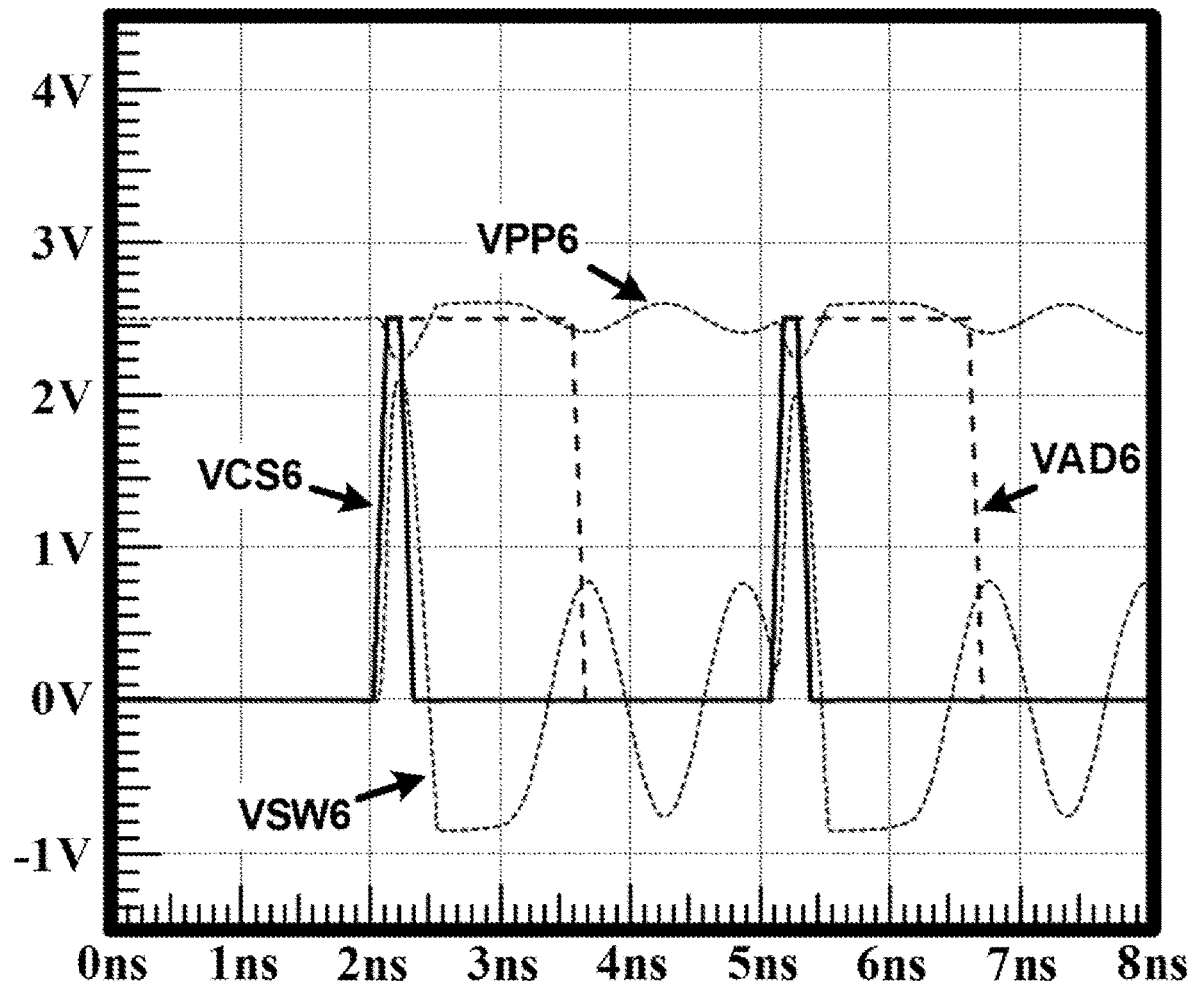
FIG. 6D illustrates voltage waveforms for during a simulated PROGRAMMING operation of a resistive change element cell in resistive change element array of FIG. 6A.
Figure 6E:
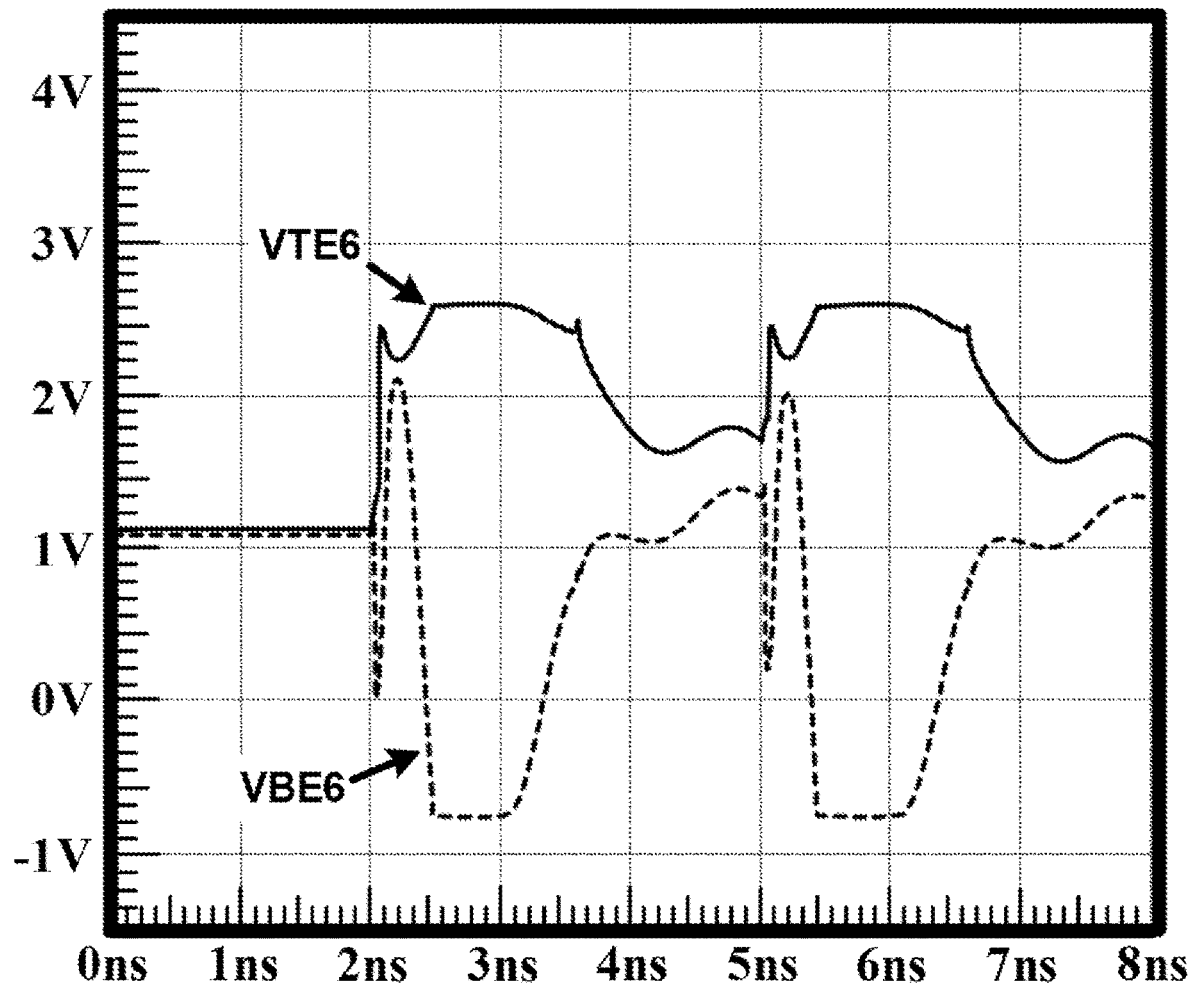
FIG. 6E illustrates voltage waveforms for forming an electrical stimulus during a simulated PROGRAMMING operation of a resistive change element cell in resistive change element array of FIG. 6A.
Figure 6F:
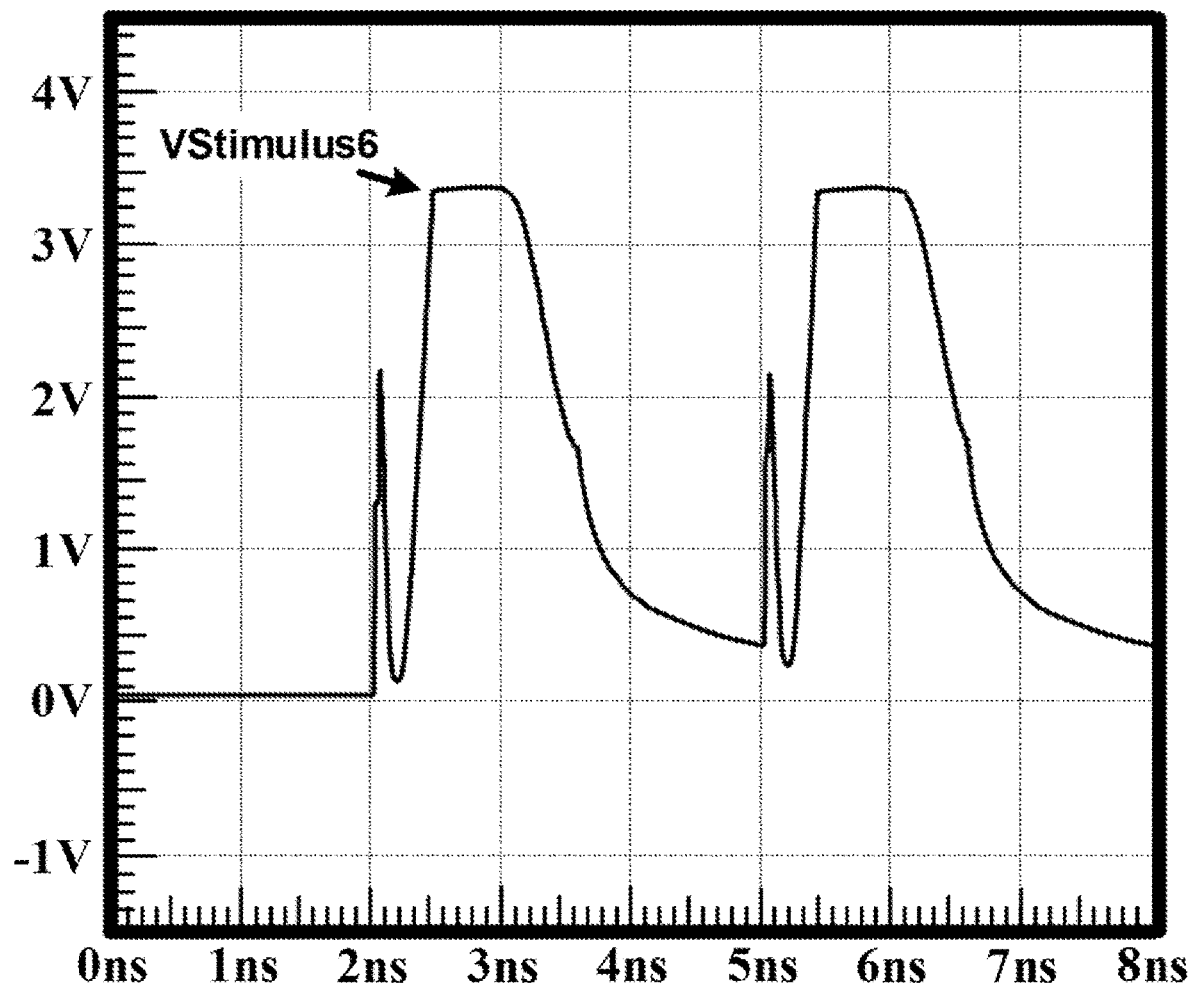
FIG. 6F illustrates a voltage waveform for an electrical stimulus during a simulated PROGRAMMING operation of a resistive change element cell in resistive change element array of FIG. 6A.

FIG. 6D illustrates a signal VCS6 supplied to the current stimulus circuit 620 by the control circuit 630, a signal VAD6 supplied to the address decoder and driver circuit 640 by the control circuit 630, a voltage waveform VPP6 on the Vpp line 613 and a voltage waveform VSW6 on the Vss_Write line 615 during a simulated PROGRAMMING operation of a resistive change element in the resistive change element array of FIG. 6A. FIG. 5E illustrates a voltage waveform VTE6 and a voltage waveform VBE6 transmitted by the address decoder and driver circuit 640 based on the signal VAD6 supplied to the address decoder and driver circuit 640 by the control circuit 630. FIG. 6F illustrates an electrical stimulus Vstimulus6 applied to a resistive change element cell. It is noted that first system voltage Vpp is 2.5 volts and the second system voltage Vss is 0 volts for the simulated PROGRAMMING operation. It is also noted that the voltage waveform VSW6 on the Vss_Write line 615 has a minimum voltage level clamped to a voltage level approximately one diode drop less than the voltage level of the Vss line 617 because the address decoder and driver circuit 640 for the simulated PROGRAMMING operation clamps a minimum voltage on the Vss_Write line 615 to a voltage level approximately one diode drop less than the voltage level of the Vss line 617. It is further noted that the address decoder and driver circuit 640 can receive additional signals, such as address signals, from the control circuit 630, however, additional signals are not discussed for describing the simulated PROGRAMMING operation.

The signal VCS6 supplied to the current stimulus circuit 620, as shown in FIG. 6D, is a square wave having an amplitude of approximately 2.5 volts, a period of approximately 0.3 nanoseconds (ns), a frequency of approximately 333.3 MHz, and a duty cycle of approximately 8.3%. The signal VCS6 supplied to the current stimulus circuit 620 by the control circuit 630 turns on the current stimulus circuit 620 at approximately 2 ns, turns off the current stimulus circuit 620 at approximately 2.3 ns, turns on the current stimulus circuit 620 at approximately 5 ns, and turns off the current stimulus circuit 620 at approximately 5.3 ns. When the current stimulus circuit 620 is turned on the current stimulus circuit 620 creates a current path from the Vpp line 613 to the Vss_Write line 615 through the current stimulus circuit 620 and when the current stimulus circuit 620 is turned off the current stimulus circuit 620 removes the current path from the Vpp line 613 to the Vss_Write line 615. Turning on and off the current stimulus circuit 620 twice creates a current stimulus having two current spikes. The voltage on the Vss_Write line 615 changes from the steady state voltage of 0 volts and begins ringing or oscillating around the steady state voltage of 0 volts at approximately 2 ns in response to the current stimulus as shown in FIG. 6D. The voltage ringing or oscillating around the steady state voltage of 0 volts on the Vss_Write line 615 attenuates over time after the first current spike, returns to approximately a maximum amplitude after the second current spike, and attenuates over time after the second current spike. The voltage on the Vpp line 613 remains substantially constant at 0 volts.

The signal VAD6 supplied to the address decoder and driver circuit 540, as shown in FIG. 6D, is a square wave having an amplitude of approximately 2.5 volts, a period of approximately 3 nanoseconds (ns), a frequency of approximately 333.3 MHz, and a duty cycle of approximately 50%. The address decoder and driver circuit 640 transmits the voltage waveform on the Vpp line 613 and the voltage waveform on the Vss_Write line 615 from approximately 2 ns to approximately 3.6 ns and from approximately 5 ns to approximately 6.6 ns to a resistive change element cell in the resistive change element array 650 based on the signal VAD6 supplied by the control circuit 630. The address decoder and driver circuit 640 electrically connects the resistive change element cell to the Vpp line 613 and the Vss_Write line 615 at approximately 2 ns, electrically disconnects the resistive change element cell from the Vpp line 613 and the Vss_Write line 615 at approximately 3.6 ns, electrically connects the resistive change element cell to the Vpp 613 and the Vss_Write line 615 at approximately 5 ns, and electrically disconnects the resistive change element cell from the Vpp line 613 and the Vss_Write line 615 at approximately 6.6 ns. FIG. 6E shows the voltage waveform VTE6 transmitted by the address decoder and driver circuit 640 from approximately 2 ns to approximately 3.6 ns and from approximately 5 ns to approximately 6.6 ns and the voltage waveform VBE6 transmitted by the address decoder and driver circuit 440 from approximately 2 ns to approximately 3.6 ns and from approximately 5 ns to approximately 6.6 ns. It is noted that shape of the voltage waveform VTE6 differs from the voltage waveform VPP6 on the Vpp line 613 because the impedance of the Vpp line 613 differs from the $V_{TE}$ line 643. It is also noted that shape of the voltage waveform VBE6 differs from the voltage waveform VSW6 on the Vss_Write line 615 because the impedance of the Vss_Write line 615 differs from the $V_{BE}$ line 645.

The electrical stimulus Vstimulus6, as shown in FIG. 6F has a first voltage pulse having a voltage of approximately 3.4 volts and a second voltage pulse having a voltage of approximately 3.4 volts. The first voltage pulse of the electrical stimulus is formed by the voltage waveform VPP6 on the Vpp line 613 transmitted by the address decoder and driver circuit 640 from approximately 2 ns to approximately 3.6 ns and the voltage waveform VSW6 on the Vss_Write line 615 transmitted by the address decoder and driver circuit 640 from approximately 2 ns to approximately 3.6 ns. The second voltage pulse of the electrical stimulus is formed by the voltage waveform VPP6 on the Vpp line 613 transmitted by the address decoder and driver 640 from approximately 5 ns to approximately 6.6 ns and the voltage waveform VSW6 on the Vss_Write line 615 transmitted by the address decoder and driver circuit 640 from approximately 5 ns to approximately 6.6 ns.

Although the present disclosure has been described in relation to particular embodiments thereof, many other variations and modification and other uses will become apparent to those skilled in the art. It is preferred, therefore, that the present disclosure not be limited by the specific disclosure herein.

What is claimed is:

1. An electrical device, comprising:
   a resistive change element array comprising a plurality of resistive change element cells, wherein each resistive change element cell comprises a resistive change element, and wherein each resistive change element is adjustable between at least two resistive states;
   a control circuit;
   a circuit electrically connected to said control circuit, wherein said circuit is configured to receive a signal from said control circuit and generate a first voltage waveform and a second voltage waveform based on said signal, and wherein said first voltage waveform oscillates around a first voltage and said second voltage waveform oscillates around a second voltage; and
   an address decoder and driver circuit electrically connected to said resistive change element array, said control circuit, and said circuit, wherein said address decoder and driver circuit is configured to receive signals from said control circuit and electrically connect at least one resistive change element cell in said plurality of resistive change element cells to said circuit based on said signals.

2. The electrical device of claim 1, wherein each resistive change element cell further comprises a selection device electrically connected to said resistive change element.

3. The electrical device of claim 1, wherein each resistive change element is selected from the group consisting of a two-terminal nanotube switching element, a phase change memory element, a metal oxide memory element, and a conductive bridge memory element.

4. The electrical device of claim 1, wherein said address decoder and driver circuit is configured to clamp a maximum voltage of said first voltage waveform.

5. The electrical device of claim 1, wherein said address decoder and driver circuit is configured to clamp a minimum voltage of said second voltage waveform.

6. An electrical device, comprising:
- a resistive change element array comprising a plurality of resistive change element cells, wherein each resistive change element cell comprises a resistive change element, and wherein each resistive change element is adjustable between at least two resistive states;
- a control circuit;
- a circuit electrically connected to said control circuit, wherein said circuit is configured to receive a signal from said control circuit and generate a first voltage waveform based on said signal, wherein said first voltage waveform oscillates around a first voltage, and wherein said circuit is configured to supply a second voltage; and
- an address decoder and driver circuit electrically connected to said resistive change element array, said control circuit, and said circuit, wherein said address decoder and driver circuit is configured to receive signals from said control circuit and electrically connect at least one resistive change element cell in said plurality of resistive change element cells to said circuit based on said signals.

7. The electrical device of claim 6, wherein each resistive change element cell further comprises a selection device electrically connected to said resistive change element.

8. The electrical device of claim 6, wherein each resistive change element is selected from the group consisting of a two-terminal nanotube switching element, a phase change memory element, a metal oxide memory element, and a conductive bridge memory element.

9. The electrical device of claim 6, wherein said address decoder and driver circuit is configured to clamp a maximum voltage of said first voltage waveform.

10. The electrical device of claim 6, wherein said address decoder and driver circuit is configured to clamp a minimum voltage of said first voltage waveform.

11. An electrical device, comprising:
- a resistive change element array comprising a plurality of resistive change element cells, wherein each resistive change element cell comprises a resistive change element, and wherein each resistive change element is adjustable between at least two resistive states;
- a circuit configured to generate a first voltage waveform and a second voltage waveform in response to a current stimulus, wherein said first voltage waveform oscillates around a first voltage and said second voltage waveform oscillates around a second voltage; and
- an address decoder and driver circuit electrically connected to said resistive change element array and said circuit, wherein said address decoder and driver circuit is configured to electrically connect at least one resistive change element cell in said plurality of resistive change element cells to said circuit to create a current stimulus, and wherein said address decoder and driver circuit is configured to electrically connect at least one resistive change element cell in said plurality of resistive change element cells to said circuit to apply an electrical stimulus formed by at least part of said first voltage waveform and at least part of said second voltage waveform.

12. The electrical device of claim 11, wherein each resistive change element cell further comprises a selection device electrically connected to said resistive change element.

13. The electrical device of claim 11, wherein each resistive change element is selected from the group consisting of a two-terminal nanotube switching element, a phase change memory element, a metal oxide memory element, and a conductive bridge memory element.

14. The electrical device of claim 11, wherein said address decoder and driver circuit is configured to clamp a maximum voltage of said first voltage waveform.

15. The electrical device of claim 11, wherein said address decoder and driver circuit is configured to clamp a minimum voltage of said second voltage waveform.

16. An electrical device, comprising:
- a resistive change element array comprising a plurality of resistive change element cells, wherein each resistive change element cell comprises a resistive change element, and wherein each resistive change element is adjustable between at least two resistive states;
- a circuit configured to generate a first voltage waveform in response to a current stimulus, wherein said first voltage waveform oscillates around a first voltage, and wherein said circuit is configured to supply a second voltage; and
- an address decoder and driver circuit electrically connected to said resistive change element array and said circuit, wherein said address decoder and driver circuit is configured to electrically connect at least one resistive change element cell in said plurality of resistive change element cells to said circuit to create a current stimulus, and wherein said address decoder and driver circuit is configured to electrically connect at least one resistive change element cell in said plurality of resistive change element cells to said circuit to apply an electrical stimulus formed by at least part of said first voltage waveform and said second voltage.

17. The electrical device of claim 16, wherein each resistive change element cell further comprises a selection device electrically connected to said resistive change element.

18. The electrical device of claim 16, wherein each resistive change element is selected from the group consisting of a two-terminal nanotube switching element, a phase change memory element, a metal oxide memory element, and a conductive bridge memory element.

19. The electrical device of claim 16, wherein said address decoder and driver circuit is configured to clamp a maximum voltage of said first voltage waveform.

20. The electrical device of claim 16, wherein said address decoder and driver circuit is configured to clamp a minimum voltage of said first voltage waveform.

* * * * *